(12) United States Patent
Wang et al.

(10) Patent No.: US 11,947,762 B2
(45) Date of Patent: Apr. 2, 2024

(54) TOUCH PANEL AND TOUCH DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lingran Wang, Beijing (CN); Jun Yan, Beijing (CN); Wenhui Gao, Beijing (CN); Gukhwan Song, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 167 days.

(21) Appl. No.: 17/617,401

(22) PCT Filed: Oct. 27, 2020

(86) PCT No.: PCT/CN2020/123971
§ 371 (c)(1),
(2) Date: Dec. 8, 2021

(87) PCT Pub. No.: WO2022/087820
PCT Pub. Date: May 5, 2022

(65) Prior Publication Data
US 2022/0308702 A1    Sep. 29, 2022

(51) Int. Cl.
*G06F 3/044*    (2006.01)
*G06F 3/041*    (2006.01)
*H10K 59/40*    (2023.01)

(52) U.S. Cl.
CPC .......... *G06F 3/0446* (2019.05); *G06F 3/0443* (2019.05); *G06F 3/0448* (2019.05);
(Continued)

(58) Field of Classification Search
CPC .... G06F 3/0446; G06F 3/0448; G06F 3/0443; H10K 59/40
(Continued)

(56) References Cited

U.S. PATENT DOCUMENTS

| | | | |
|---|---|---|---|
| 7,538,288 B1 * | 5/2009 | Huang | G06F 3/045 |
| | | | 200/600 |
| 10,503,293 B2 | 12/2019 | Seong | |

(Continued)

FOREIGN PATENT DOCUMENTS

| | | |
|---|---|---|
| CN | 109634471 | 4/2019 |
| CN | 110750177 | 2/2020 |
| CN | 111488086 | 8/2020 |

OTHER PUBLICATIONS

Fan Yanyun et al. A touch display panel and a touch display device Apr. 16, 2019 Xiamen Tianma Micro Electronics Co Ltd CN109634471 (A) paragraphs 2-64, figures 1-11 English Bibliographic data: and specification.*

(Continued)

*Primary Examiner* — Prabodh M Dharia
(74) *Attorney, Agent, or Firm* — Dority & Manning, PA

(57) ABSTRACT

A touch panel includes a base substrate and a touch function layer disposed on the base substrate. The touch function layer includes first and second touch units. Each first touch unit includes first touch electrodes, and each second touch unit includes second touch electrodes. The first touch electrodes and the second touch electrodes are insulated from each other. The base substrate has at least two mounting holes and has a gap region at a position corresponding to a region between two adjacent mounting holes. In a first touch unit passing through the gap region, first touch electrodes located in the gap region serve as a first gap electrode and a second gap electrode. In a second touch unit passing through the gap region, second touch electrodes located in the gap region serve as a third gap electrode located between the first and second gap electrodes and a fourth gap electrode.

19 Claims, 22 Drawing Sheets

(52) U.S. Cl.
    CPC .......... H10K 59/40 (2023.02); *G06F 3/0412* (2013.01); *G06F 2203/04107* (2013.01); *G06F 2203/04111* (2013.01); *G06F 2203/04112* (2013.01)

(58) Field of Classification Search
    USPC .......................................... 345/174; 200/600
    See application file for complete search history.

(56) References Cited

U.S. PATENT DOCUMENTS

| | | | |
|---|---|---|---|
| 2016/0109993 A1* | 4/2016 | Hung | G06F 3/0448 345/174 |
| 2017/0308202 A1* | 10/2017 | Fang | G02F 1/0316 |
| 2020/0064968 A1 | 2/2020 | Kim et al. | |
| 2020/0110525 A1 | 4/2020 | Park et al. | |
| 2020/0173949 A1 | 6/2020 | Lee et al. | |
| 2020/0278571 A1* | 9/2020 | Kajita | G06F 3/0412 |
| 2021/0397320 A1 | 12/2021 | Ye | |

OTHER PUBLICATIONS

Fan Yanyun et al. A touch display panel and a touch display device Apr. 16, 2019 Xiamen Tianma Micro Electronics Co Ltd CN109634471 (A) paragraphs 2-64, figures 1-11 Chinese Bibliographic data; specification and figures.*

PCT International Search Report (w/ English translation) for corresponding PCT Application No. PCT/CN2020/123971, dated Aug. 2, 2021, 5 pages.

* cited by examiner

TOUCH PANEL AND TOUCH DISPLAY APPARATUS

CROSS-REFERENCE TO RELATED APPLICATION

The present application is a national phase entry under 35 USC 371 of International Patent Application No. PCT/CN2020/123971, filed on Sep. 10, 2020, which is incorporated herein by reference in its entirety.

TECHNICAL FIELD

The present disclosure relates to the field of display technologies, and in particular, to a touch panel and a touch display apparatus.

BACKGROUND

With the continuous development of electronic products, touch display apparatuses with touch and display functions may achieve simple and flexible human-computer interaction, and thus are widely used. Touch panels in the touch display apparatuses include, for example, one glass solution (OGS) touch panels, on-cell touch panels, and in-cell touch panels.

SUMMARY

In an aspect, a touch panel having a touch area is provided. The touch panel includes a base substrate and a touch function layer disposed on the base substrate. The touch function layer includes a plurality of first touch units extending in a first direction and a plurality of second touch units extending in a second direction. Each first touch unit includes a plurality of first touch electrodes arranged in the first direction and connected in series, and each second touch unit includes a plurality of second touch electrodes arranged in the second direction and connected in series. The first touch electrodes and the second touch electrodes are insulated from each other. The first direction intersects the second direction.

The base substrate has at least two mounting holes located in the touch area, and the touch function layer is hollowed out at positions corresponding to the at least two mounting holes and has a gap region at a position corresponding to a region between two adjacent mounting holes.

In a first touch unit passing through the gap region, first touch electrodes located in the gap region serve as a first gap electrode and a second gap electrode that are arranged in the first direction and are electrically connected to each other. In a second touch unit passing through the gap region, second touch electrodes located in the gap region serve as a third gap electrode and a fourth gap electrode that are arranged in the second direction and are electrically connected to each other. The third gap electrode is located between the first gap electrode and the second gap electrode in the first direction.

In some embodiments, a contour of the first gap electrode and/or a contour of the second gap electrode are at least partially different from a contour of a first touch electrode located in a non-gap region. A contour of the third gap electrode and/or a contour of the fourth gap electrode are at least partially different from a contour of a second touch electrode located in the non-gap region. The third gap electrode is embedded in an integrated electrode formed by electrically connecting the first gap electrode and the second gap electrode.

In some embodiments, a mutual capacitance value between a whole of the first gap electrode and the second gap electrode, and a whole of the third gap electrode and the fourth gap electrode is C1, a mutual capacitance value between a first touch electrode and a second touch electrode located in a non-gap region is C2, and a ratio of C1 to C2 is in a range of 0.75 to 0.8.

In some embodiments, a distance between the two adjacent mounting holes located at both sides of the gap region is in a range of 900 μm to 1200 μm.

In some embodiments, a ratio of a sum of areas of the third gap electrode and the fourth gap electrode to a sum of areas of the first gap electrode and the second gap electrode is in a range of 1.2 to 1.4.

In some embodiments, a ratio of areas of a second touch electrode and a first touch electrode that are in a non-gap region is in a range of 0.9 to 1.

In some embodiments, an edge of at least one of the third gap electrode and the fourth gap electrode has at least one branch, and the edge is proximate to at least one of the first gap electrode or the second gap electrode. The at least one branch extends into the at least one of the first gap electrode or the second gap electrode.

In some embodiments, an edge of the branch is zigzag-shaped.

In some embodiments, shapes of portions, proximate to each other, of contours of the third gap electrode and the first gap electrode are complementary, and shapes of portions, proximate to each other, of contours of the third gap electrode and the second gap electrode are complementary.

In some embodiments, the contour of the third gap electrode has protrusions in various shapes, and the protrusions in various shapes include at least two types of wavy protrusions, rectangular protrusions, trapezoidal protrusions or triangular protrusions.

The third gap electrode includes a first portion, a second portion, and a third portion that are connected as a whole, and the first portion, the second portion and the third portion are arranged in sequence in a direction from the third gap electrode to the fourth gap electrode. Average dimensions of the first portion and the third portion in the first direction are both less than an average dimension of the second portion in the first direction.

In some embodiments, the contour of the third gap electrode has the wavy protrusions. The wavy protrusions are on a portion, proximate to the first gap electrode, of a contour of the first portion and a portion, proximate to the second gap electrode, of a contour of the first portion.

In some embodiments, the two adjacent mounting holes located at both sides of the gap region are a first mounting hole and a second mounting hole, and the first mounting hole and the second mounting hole are arranged in the first direction. The first gap electrode is adjacent to a side of the first mounting hole proximate to the gap region, and the second gap electrode is adjacent to a side of the second mounting hole proximate to the gap region.

A region, around the first mounting hole and the second mounting hole and not including the gap region, in the touch area is a hole edge region. A region, except for the gap region and the hole edge region, in the touch area is a normal region.

In some embodiments, the first touch electrodes and the second touch electrodes each have a structure of metal mesh. A line width of metal mesh of at least one of the first gap electrode, the second gap electrode, the third gap electrode or the fourth gap electrode is greater than a line width of metal mesh of touch electrodes located in the normal region.

In some embodiments, the line width of the metal mesh of the at least one of the first gap electrode, the second gap electrode, the third gap electrode or the fourth gap electrode is in a range of 3.8 μm to 5.2 μm, and the line width of the metal mesh of the touch electrode located in the normal region is in a range of 2.8 μm to 4.2 μm.

In some embodiments, the first gap electrode includes a first main sub-electrode and a first compensation sub-electrode arranged proximate to the first mounting hole. The first main sub-electrode has a structure of metal mesh, the first compensation sub-electrode is a planar electrode, and the first main sub-electrode is electrically connected to the first compensation sub-electrode. And/or, the second gap electrode includes a second main sub-electrode and a second compensation sub-electrode arranged proximate to the second mounting hole. The second main sub-electrode has a structure of metal mesh, the second compensation sub-electrode is a planar electrode, and the second main sub-electrode is electrically connected to the second compensation sub-electrode.

In some embodiments, a ratio of a sum of areas of the third gap electrode and the fourth gap electrode to a sum of an area of the metal mesh of the first main sub-electrode, an area of the first compensation sub-electrode, an area of the metal mesh of the second main sub-electrode and an area of the second compensation sub-electrode is less than 1.3 and greater than or equal to 1.

In some embodiments, in touch units passing through the first mounting hole and the second mounting hole, each touch electrode located in the hole edge region serves as a hole edge electrode. The hole edge electrode includes: a main sub-electrode and a compensation sub-electrode arranged proximate to a corresponding mounting hole. The main sub-electrode has a structure of metal mesh, the compensation sub-electrode is a planar electrode, and the main sub-electrode is electrically connected to the compensation sub-electrode.

In some embodiments, the touch function layer further includes a first connection line extending along a contour of the second mounting hole. In a second touch unit passing through the first mounting hole, two second touch electrodes located at both sides of the first mounting hole in the second direction serve as a first hole edge electrode and a second hole edge electrode. The first hole edge electrode, the third gap electrode, the fourth gap electrode and the second hole edge electrode are electrically connected in sequence. In a second touch unit passing through the second mounting hole, two second touch electrodes located at both sides of the second mounting hole in the second direction serve as a third hole edge electrode and a fourth hole edge electrode. The third hole edge electrode is electrically connected to the fourth hole edge electrode through the first connection line.

A whole formed by electrically connecting the first hole edge electrode, the third gap electrode, the fourth gap electrode and the second hole edge electrode is insulated from a whole formed by electrically connecting the third hole edge electrode, the fourth hole edge electrode and the first connection line.

In some embodiments, the touch function layer further includes a second connection line extending along a contour of the first mounting hole and a third connection line extending along a contour of the second mounting hole. In the first touch unit passing through the first mounting hole and the second mounting hole, a first touch electrode located at a side of the first mounting hole away from the second mounting hole serves as a fifth hole edge electrode, and a first touch electrode located at a side of the second mounting hole away from the first mounting hole serves as a sixth hole edge electrode. The fifth hole edge electrode is electrically connected to the first gap electrode through the second connection line. The sixth hole edge electrode is electrically connected to the second gap electrode through the third connection line.

In some embodiments, each second touch unit further includes a plurality of bridge structures, and any two adjacent second touch electrodes are electrically connected through a bridge structure in the second direction. The third gap electrode is electrically connected to the fourth gap electrode through a bridge structure located in the gap region. In the second touch unit passing through the gap region, a line connecting a center of any bridge structure located in a non-gap region and a center of the bridge structure for connecting the third gap electrode and the fourth gap electrode intersects the second direction.

In some embodiments, a layer where the first touch electrodes and the second touch electrodes are located serves as a touch electrode layer. Any two adjacent first touch electrodes are directly electrically connected in the first direction, and any two adjacent second touch electrodes are disposed separately from each other in the second direction. A layer where bridge structures of the plurality of second touch units are located serves as a bridge structure layer, and the bridge structure layer is located on a side of the touch electrode layer proximate to or away from the base substrate.

The touch function layer further includes an insulating layer located between the touch electrode layer and the bridge structure layer, and the insulating layer has a plurality of via holes. In the second direction, any two adjacent second touch electrodes are electrically connected to a bridge structure through different via holes.

The bridge structure for connecting the third gap electrode and the fourth gap electrode is a gap bridge structure, and the third gap electrode and the fourth gap electrode are electrically connected to the gap bridge structure through different via holes in the insulating layer.

In some embodiments, the gap bridge structure has a hollow portion. An orthogonal projection of a conductive pattern of the first gap electrode in contact with the second gap electrode on the base substrate partially overlaps an orthogonal projection of the hollow portion of the gap bridge structure on the base substrate.

In some embodiments, the touch electrode layer includes a third hole edge electrode, a fourth hole edge electrode, a fifth hole edge electrode, a sixth hole edge electrode, a second connection line and a third connection line.

The bridge structure layer includes a first connection line, and the first connection line is electrically connected to the third hole edge electrode and the fourth hole edge electrode through different via holes in the insulating layer. The second connection line is directly electrically connected to the fifth hole edge electrode and the first gap electrode. The third connection line is directly electrically connected to the sixth hole edge electrode and the second gap electrode.

In some embodiments, in a radial direction of each mounting hole, the touch function layer further includes: a light blocking portion, at least one connection line, first signal shielding portions and electrode lines that extend along a contour of the mounting hole in sequence.

The light blocking portion extends along an edge of the mounting hole to form a closed-loop structure, and the light blocking portion is configured to block light passing through the mounting hole from entering a region around the mounting hole. The connection line is configured to electrically connect two adjacent first touch electrodes arranged in the first direction, or electrically connect two adjacent second touch electrodes arranged in the second direction. An electrode line is configured to be electrically connected to an edge, proximate to the mounting hole, of a first touch electrode or a second touch electrode. A first signal shielding portion is disposed at least between a connection line and an electrode line that are adjacent.

In some embodiments, the at least one connection line includes a plurality of connection lines, and a plurality of the connection lines disposed between the light blocking portion and the first signal shielding portion. The touch function layer further includes a second signal shielding portion provided between two adjacent connection lines, and the second signal shielding portion extends along the contour of the mounting hole.

In another aspect, a touch display apparatus is provided. The touch display apparatus includes the touch panel according to any one of the embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
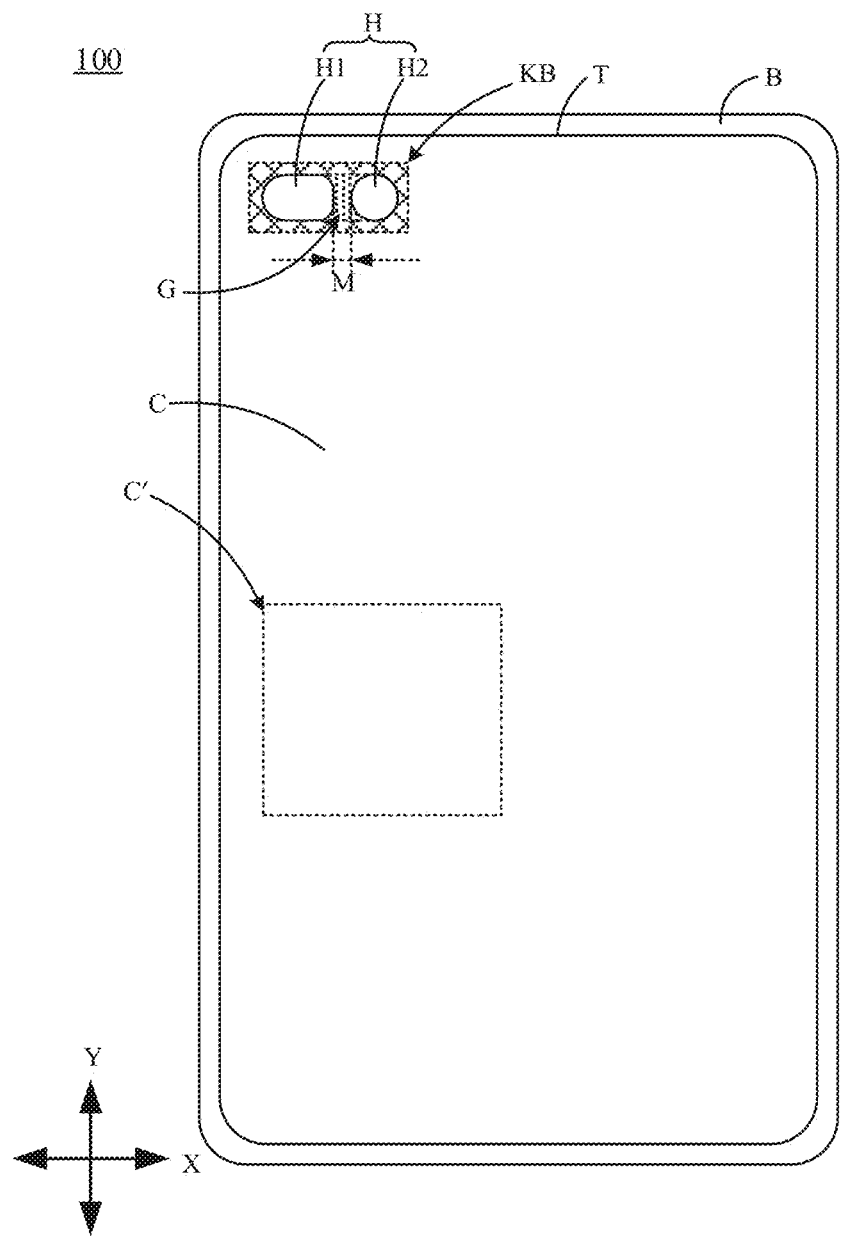
FIG. 1 is a top view of a touch panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "connected" and "electrically connected" and their extensions may be used. For example, the term "connected" may be used when describing some embodiments to indicate that two or more components are in direct physical contact or electrical contact with each other. The embodiments disclosed herein are not necessarily limited to the contents herein.

The phrase "A and/or B" includes the following three combinations: only A, only B, and a combination of A and B.

The use of the phrase "configured to" herein means an open and inclusive language, which does not exclude devices that are configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the term "approximately" or "substantially" includes a stated value and an average value within an acceptable range of deviation of a particular value. The acceptable range of deviation is determined by a person of ordinary skill in the art in view of the measurement in question and the error associated with a particular amount of measurement (i.e., the limitations of the measurement system).

Exemplary embodiments are described herein with reference to sectional views and/or plan views as idealized exemplary drawings. In the accompanying drawings, thickness of layers and sizes of regions are enlarged for clarity. Variations in shape with respect to the drawings due to, for example, manufacturing technologies and/or tolerances may be envisaged. Therefore, the exemplary embodiments should not be construed to be limited to shapes of the regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

With the rapid development of active matrix organic light-emitting diode (AMOLED) display apparatuses, full screen, narrow bezel, high resolution, curling wear, folding and the like have become important development directions for AMOLED in the future.

A light and thin touch panel is manufactured by using a technology of directly fabricating a touch structure on an encapsulation layer of an organic light-emitting diode (OLED) display panel (i.e., flexible metal layer on cell (FMLOC)), and this technology may be applied to foldable or rollable OLED display apparatuses.

In addition, in order to effectively use a screen space and increase a screen-to-body ratio (i.e., a ratio of an area of a display area that is actually used to display images to an area of an entire front surface of the display panel), a punching technology is used for placing functional devices such as cameras in the OLED display panel, and this technology is called as an active area hole (AA Hole) technology.

Figure 26A:
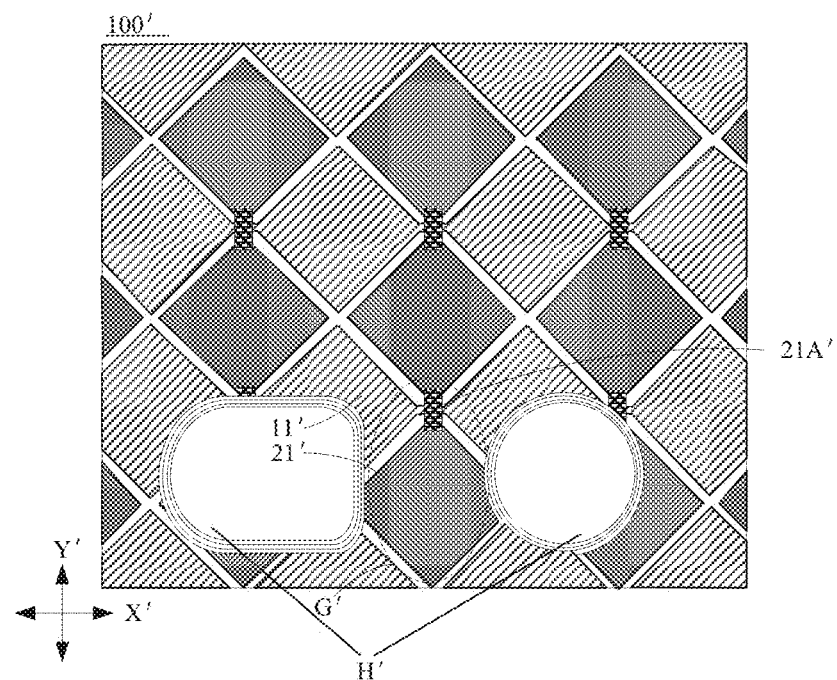
FIG. 26A is a simplified top view of a gap region of a touch panel of the related art.
Figure 26B:
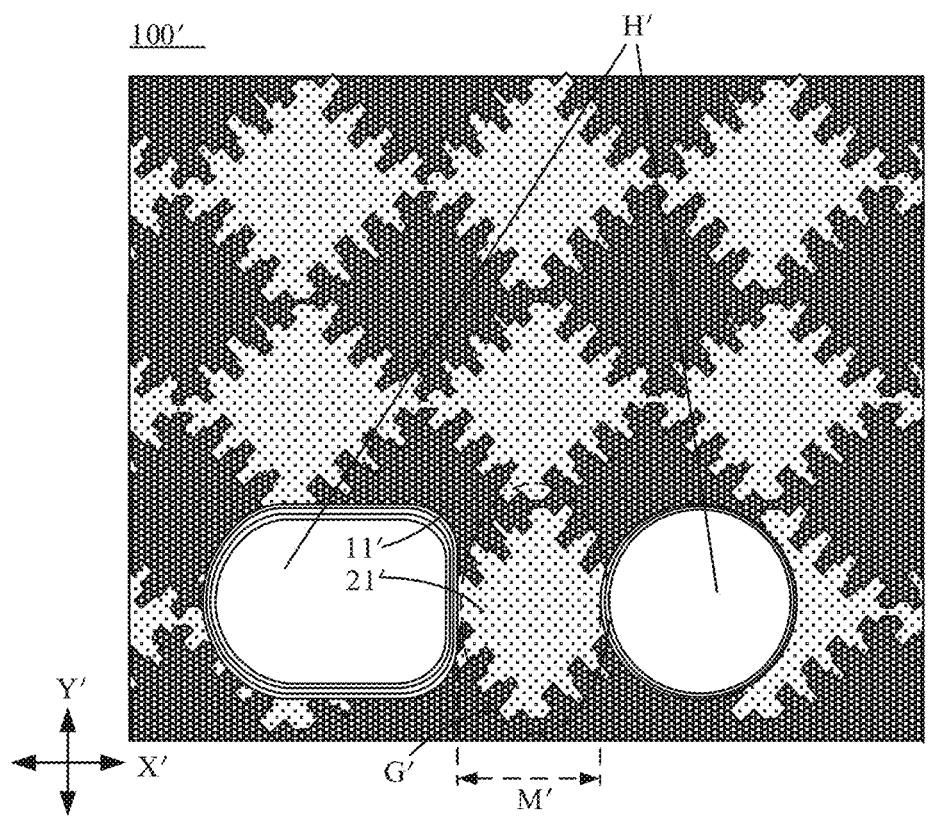
FIG. 26B is a specific top view of a gap region of a touch panel of the related art.

As shown in FIGS. 26A and 26B, a touch panel 100' generally includes a plurality of touch electrodes (including first touch electrodes 11' and second touch electrodes 21') uniformly distributed, a mutual capacitance may be generated between adjacent different touch electrodes (i.e., a first touch electrode 11' and a second touch electrode 21'), and a value of the mutual capacitance changes after the touch panel 100' is touched, so that a change amount of the mutual capacitance value may be determined by detecting the mutual capacitance value, and in turn a touch position may be determined.

A technical solution of punching holes (mounting holes H' as shown in FIGS. 26A and 26B) inside an OLED display panel integrated with a touch structure may destroy a integrity of touch electrodes of the touch structure at punching positions in the OLED display panel, especially in a case where two mounting holes H' are provided in the OLED display panel, and a distance M' between the two mounting holes H' is in a range of 900 μm to 1200 μm. In some examples, the distance M' between the two mounting holes H' is in a range of 1000 μm to 1100 μm. For example, the distance M' is 1000 μm, 1050 μm, 1071 μm, 1071.8 μm, 1072 μm, 1090 μm, or 1100 μm. Since the distance M' between the two mounting holes H' is relatively small, the integrity of touch electrodes at a gap region G' between the two mounting holes H' cannot be guaranteed, so that a contour perimeter of a touch electrode located in the gap area G' is less than a contour perimeter of a touch electrode in a normal region, which in turn causes a facing area of touch electrodes located in the gap region G' to be less than a facing area of touch electrodes located in the normal region. As a result, there is a great difference between values of mutual capacitances generated by the touch electrodes located in the gap region G' and the touch electrodes located in the normal region after the touch panel 100' is touched. When a finger draws a line on the touch panel 100' passing through the gap area G' between the two mounting holes H', since the value of the mutual capacitance of the touch electrodes in the gap region G' is small, the drawn line may become deformed in the gap region G', for example, be curved or even broken, which results in poor linearity of drawn line of the touch panel 100'.

Based on this, as shown in FIG. 1, some embodiments of the present disclosure provide a touch panel 100. The touch panel 100 has a touch area T, and the touch panel 100 may further have a frame area B located around the touch area T.

The touch panel 100 may be stacked with a display layer to form a touch display apparatus, and the touch panel 100 may be provided with mounting holes for installing functional devices such as cameras. In this case, the touch area T of the touch panel 100 overlaps a display area AA (also referred to as an active area) in the display layer. The touch area T is provided with at least two mounting holes H therein, and the at least two mounting holes H correspond to mounting holes in the display panel for installing functional devices such as cameras.

In the description herein, a region between two adjacent mounting holes H in the at least two mounting holes H may be referred to as a gap region G (referring to the dotted filling region between the two mounting holes H shown in FIG. 1). A region around the mounting holes H may be referred to as a hole edge region KB (a region filled with grids around the mounting hole H1 and the mounting hole H2 as shown in FIG. 1). It will be noted that, the hole edge region KB described herein does not include a region located around the mounting holes H and belonging to the gap region G, but includes a region located around the mounting holes H and not belonging to the gap region G. In the touch area T, a region except for the gap region G and the hole edge region KB may be referred to as a normal region C.

In some embodiments, as shown in FIG. 1, a distance M between two adjacent mounting holes H located at both sides of the gap region G is in a range of 900 µm to 1200 µm. That is, a dimension of the gap region G along a first direction X (i.e., an arrangement direction of the two adjacent mounting holes H) is in a range of 900 µm to 1200 µm.

For example, the distance M between the two adjacent mounting holes H located at both sides of the gap region G is in a range of 1000 µm to 1100 µm, such as 1000 µm, 1050 µm, 1071 µm, 1071.8 µm, 1072 µm, 1090 µm or 1100 µm.

It will be noted that, FIG. 1 only illustrates an example in which two mounting holes H are provided in the touch area T. However, the number of mounting holes provided in the touch area T in the embodiments of the present disclosure may be three or more than three, which may be set according to the specific situation.

Positions, sizes and shapes of the mounting holes H shown in FIG. 1 are only illustrative, and it will be understood by those skilled in the art that, the positions, sizes and shapes of the mounting holes H in the embodiments of the present disclosure are not limited thereto, and may be adjusted accordingly according to the positions, sizes and shapes of the functional devices such as cameras.

Relative sizes of the touch area T and the frame area B shown in FIG. 1 are only illustrative, and are not specifically limited thereto. In some embodiments, in a case where the touch panel 100 is applied to a full-screen display apparatus, the touch panel 100 may not be provided with a frame area B.

Figure 2:
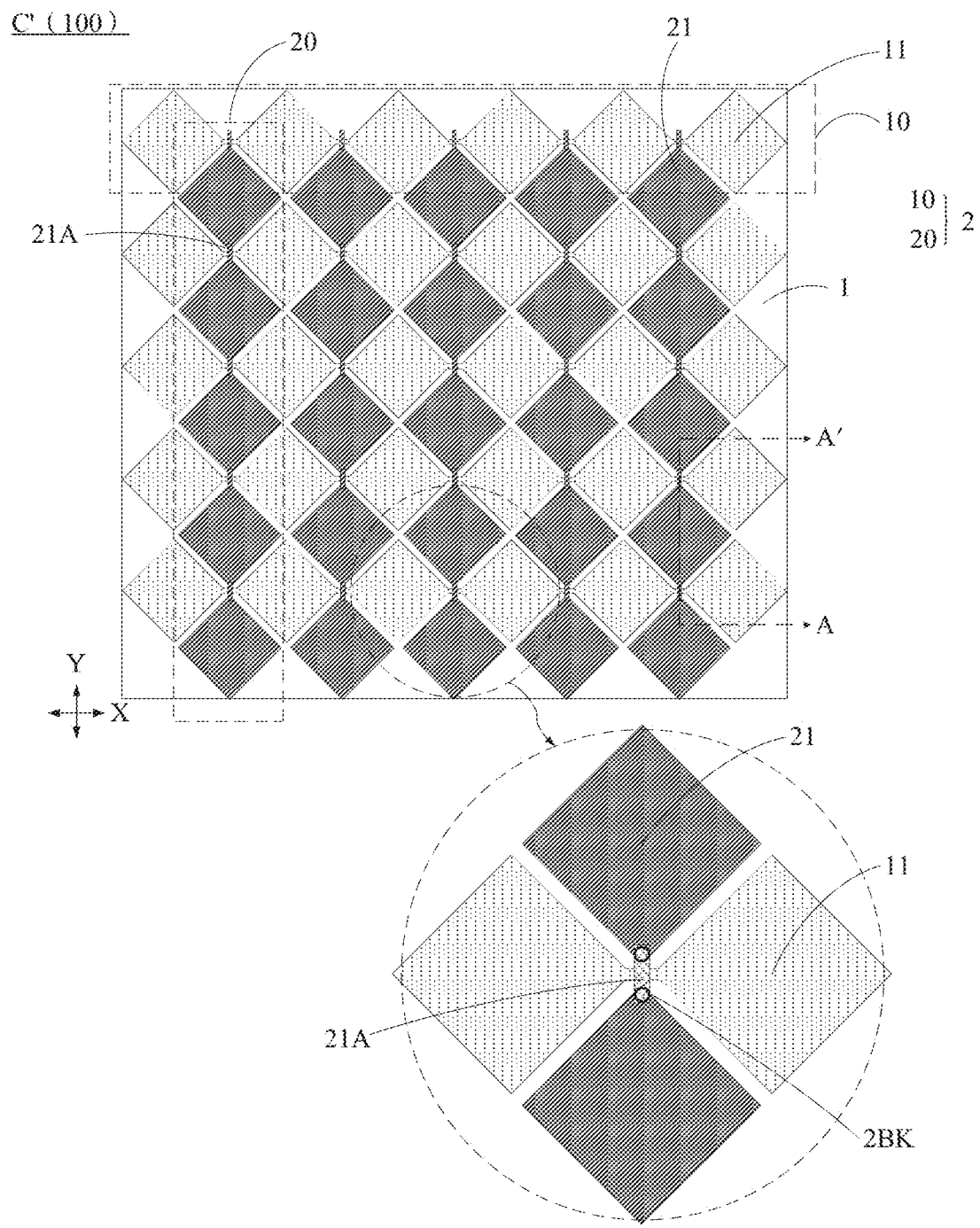
FIG. 2 is a partial enlarged view of a region shown in the dotted box C in FIG. 1.
Figure 3:
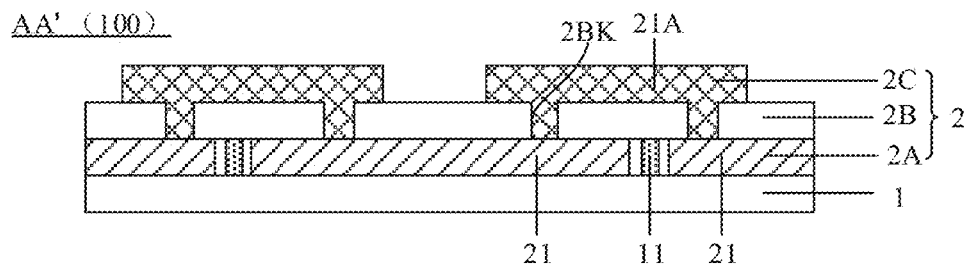
FIG. 3 is a sectional view of a touch panel taken along the line AA' in FIG. 2, in accordance with some embodiments.

In some embodiments, referring to FIGS. 2 and 3. FIG. 2 shows a top view of touch electrodes in a partial region C' in the normal region C of the touch panel 100 in FIG. 1, and FIG. 3 shows a sectional structure of the touch panel 100 in FIG. 2 along the line AA'. The touch panel 100 includes a base substrate 1 and a touch function layer 2 disposed on the base substrate 1.

As shown in FIG. 2, the touch function layer 2 includes a plurality of first touch units 10 extending in a first direction X and a plurality of second touch units 20 extending in a second direction Y. Each first touch unit 10 includes a plurality of first touch electrodes 11 arranged in the first direction X and connected in series, and each second touch unit 20 includes a plurality of second touch electrodes 21 arranged in the second direction Y and connected in series.

Every two adjacent first touch electrodes 11 are electrically connected directly in the first direction X. Each second touch unit 20 further includes a plurality of bridge structures (e.g., first bridge structures 21A shown in FIG. 2). Every two adjacent second touch electrodes 21 are electrically connected through a bridge structure, so that the first touch electrodes 11 and the second touch electrodes 21 are insulated from each other.

The first direction X intersects with the second direction Y, for example, the first direction X and the second direction Y may be perpendicular to each other. For example, the first direction X may be a lateral direction of the touch display apparatus, and the second direction Y may be a longitudinal direction of the touch display apparatus; or the first direction X may be a row direction in which pixels in the touch display apparatus are arranged, and the second direction Y may be a column direction in which the pixels in the touch display apparatus are arranged.

It will be noted that, figures of the embodiments of the present disclosure are illustrated by only taking an example in which the first direction X is the lateral direction and the second direction Y is the longitudinal direction. technical solutions obtained by rotating the figures by 90 degrees are also within the protection scope of the present disclosure.

Each of the first touch sub-electrodes 11 and the second touch sub-electrodes 21 as shown in FIG. 2 substantially has a rhombus shape. The term "substantially having a rhombus shape" means that touch electrodes (i.e., the first touch electrodes 11 and the second touch electrodes 21) are each in a shape of a rhombus as a whole, and are not limited to a standard rhombus, for example, boundaries of the touch electrodes are allowed to be non-linear (e.g., zigzag). As another example, touch electrodes concerned in the subsequent embodiments are each in a shape of a rhombus as a whole, but boundaries thereof are zigzag.

Moreover, a shape of electrode patterns of the first touch electrodes 11 and a shape of the second touch electrodes 21 in the embodiments of the present disclosure are not limited to a rhombus or a substantial rhombus, for example, they may also be a rectangle or a strip.

Figure 10:
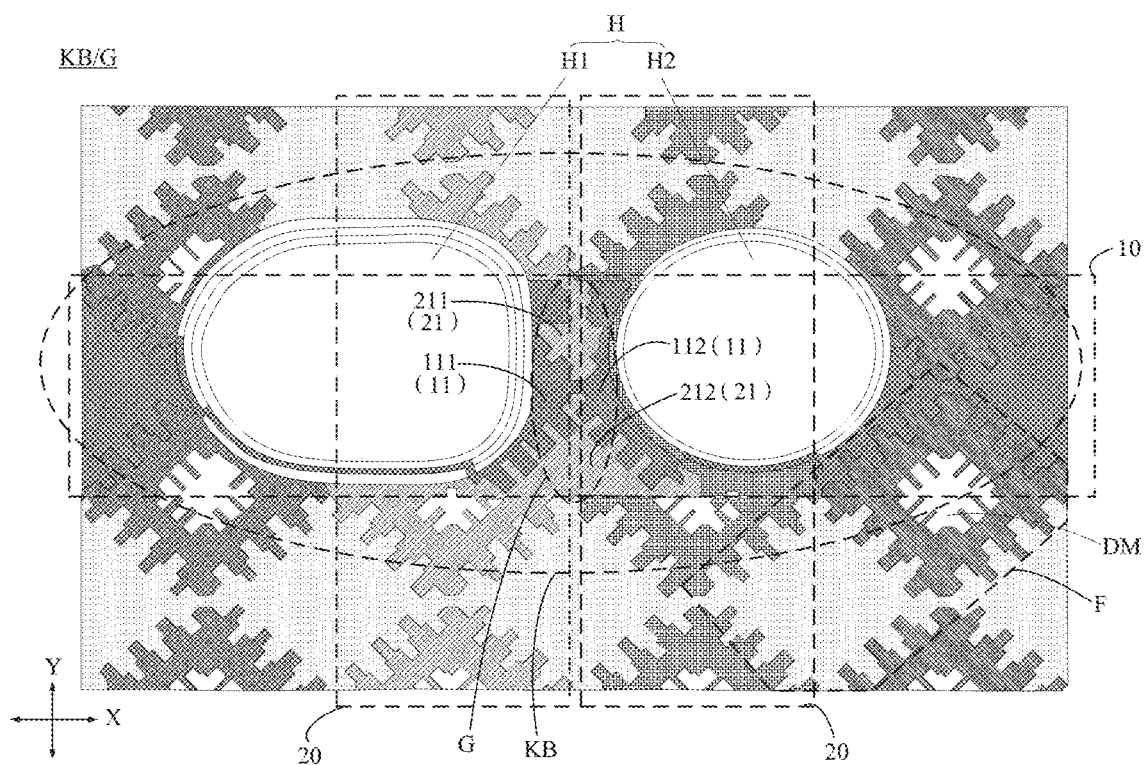
FIG. 10 is a partially enlarged view of a hole edge region and a gap region of a touch panel, in accordance with some embodiments.

FIG. 10 shows a partial enlarged structure of the gap region G and the hole edge region KB of the touch panel 100 in FIG. 1. In first touch unit(s) 10 passing through the gap region G, first touch electrodes 11 in a first touch unit located in the gap region G form a first gap electrode 111 and a second gap electrode 112 that are arranged in the first direction X and are electrically connected to each other. In second touch units 20 passing through the gap region G, second touch electrodes 21 in a second touch unit located in the gap area G form a third gap electrode 211 and a fourth gap electrode 212 arranged in the second direction Y and electrically connected to each other. The third gap electrode 211 is located between the first gap electrode 111 and the second gap electrode 112 in the first direction X, so that two sides of the third gap electrode 211 are opposite to the first gap electrode 111 and the second gap electrode 112, thereby generating mutual capacitances.

Compared to an electrode arrangement structure shown in FIGS. 26A and 26B, in the touch panel 100 provided by the embodiments of the present disclosure, in a case where the distance M between two mounting holes H is constant, the first gap electrode 111, the second gap electrode 112, the third gap electrode 211 and the fourth gap electrode 212 are provided in the gap region G, and the third gap electrode 211 is located between the first gap electrode 111 and the second gap electrode 111 in the first direction X, so that the two sides of the third gap electrode 211 in the gap region G are opposite to the first gap electrode 111 and the second gap electrode 112. As a result, contour perimeters of the first touch electrode 11 and the second touch electrode 21 in the region are increased, so that a facing area between the first touch electrode 11 and the second touch electrode 21 is increased.

It may be seen that, by adopting the electrode arrangement structure described above in the gap region G, the contour perimeters of the first touch electrode 11 and the second touch electrode 21 in this region are increased, so that the facing area between the first touch electrode 11 and the second touch electrode 21 is increased, in turn the value of the mutual capacitance between the first touch electrode 11 and the second touch electrode 21 is increased, and the situation of poor linearity of the drawn line on the touch panel 100 in the gap region G is improved.

The contour perimeters of the first touch electrode 11 and the second touch electrode 21 are each increased by 32% to 36% compared to that of the electrode arrangement structure shown in FIGS. 26A and 26B, for example, by 32%, 33%, 34%, 35% or 36%.

In the gap region G' in FIGS. 26A and 26B, the facing area between the first touch electrode 11' and the second touch electrode 21' is S'. In the electrode arrangement structure of the embodiments of the present disclosure, in the gap region G, there is a facing area between a whole of the first gap electrode 111 and the second gap electrode 112 and a whole of the third gap electrode 211 and the fourth gap electrode 212, i.e., the facing area S between the first touch electrodes 11 and the second touch electrodes 21. S is greater than S', and a ratio of S to S' is in a range of 1.1 to 1.5, for example, may be 1.1, 1.2, 1.3, 1.4 or 1.5.

A ratio of a mutual capacitance value between a first touch electrode 11' and a second touch electrode 21' in the gap region G' to a mutual capacitance value of a first touch electrode 11' and a second touch electrode 21' located in a non-gap region is in a range of 0.35 to 0.4. In the electrode arrangement structure of the embodiments of the present disclosure, a mutual capacitance value between a whole of the first gap electrode 111 and the second gap electrode 112 and a whole of the third gap electrode 211 and the fourth gap electrode 212 is C1; a mutual capacitance value between a first touch electrode 11 and a second touch electrode 21 located in the non-gap region is C2, and a ratio of C1 to C2 is in a range of 0.75 to 0.8, for example, 0.75, 0.76, 0.77, 0.79 or 0.8. It may be seen that, compared to the electrode arrangement structure shown in FIGS. 26A and 26B, in the electrode arrangement structure of the embodiments of the present disclosure, the mutual capacitance value between the first touch electrode 11 and the second touch electrode 21 located in the gap area is increased, and is closer to the mutual capacitance value between the first touch electrode 11 and the second touch electrode 21 in the non-gap region, so as to improve the situation of poor linearity of the drawn line on the touch panel 100 in the gap region G.

In some embodiments, a ratio of a sum of areas of the third gap electrode 211 and the fourth gap electrode 212 to a sum of areas of the first gap electrode 111 and the second gap electrode 112 is in a range of 1.2 to 1.4, for example, may be 1.2, 1.24, 1.3, 1.36 or 1.4.

By adjusting a proportional relation between the sum of the areas of the first gap electrode 111 and the second gap electrode 112 and the sum of the areas of the third gap electrode 211 and the fourth gap electrode 212, compared with the electrode arrangement structure shown in FIGS. 26A and 26B, the area of the first touch electrode 11 in the gap region G is increased, and the area of the second touch electrode 21 is decreased. As a result, an effect that a difference between the sum of the areas of the first gap electrode 111 and the second gap electrode 112 and the sum of the areas of the third gap electrode 211 and the fourth gap electrode 212 is reduced is reached, which is beneficial to increase the facing area of the first touch electrode 11 and the second touch electrode 21 in the gap region G.

For example, as shown in FIG. 10, the ratio of the sum of the areas of the third gap electrode 211 and the fourth gap electrode 212 to the sum of the areas of the first gap electrode 111 and the second gap electrode 112 is 1.2. That is, the sum of the areas of the first gap electrode 111 and the second gap electrode 112 is close to the sum of the areas of the third gap electrode 211 and the fourth gap electrode 212.

The sum of the areas of the first gap electrode 111 and the second gap electrode 112 is close to the sum of the areas of the third gap electrode 211 and the fourth gap electrode 212, so that the areas of the first touch electrode 11 and the second touch electrode 21 in the gap region G are close to each other. As a result, it is beneficial to further increase the facing area of the first touch electrode 11 and the second touch electrode 21.

In some embodiments, a ratio of an area of a second touch electrode 21 to an area of a first touch electrode 11 in the non-gap region is in a range of 0.9 to 1, such as 0.9, 0.92, 0.95, 0.98, or 1. That is, in the non-gap region, the areas of the second touch electrode 21 and the first touch electrode 11 are close, or equal.

In some embodiments, as shown in FIG. 10, the two adjacent mounting holes H located at both sides of the gap region G are a first mounting hole H1 and a second mounting hole H2, and the first mounting hole H1 and the second mounting hole H2 are arranged in the first direction X. The first gap electrode 111 is adjacent to a side of the first mounting hole H1 proximate to the gap region G, and the second gap electrode 112 is adjacent to a side of the second mounting hole H2 proximate to the gap region G.

In some embodiments, as shown in FIG. 10, the first gap electrode 111 and the second gap electrode 112 are electrically connected to form an integrated electrode, and the third gap electrode 211 is embedded in the integrated electrode formed by electrically connecting the first gap electrode 111 and the second gap electrode 112. In this way, it may further increase the contour perimeters of the first touch electrode 11 and the second touch electrode 21 in the gap region G, thereby increasing the facing area between the first touch electrode 11 and the second touch electrode 21.

In some embodiments, as shown in FIG. 10, shapes of portions of the contours of the third gap electrode 211 and the first gap electrode 111 proximate to each other are complementary, and shapes of portions of the contours of the third gap electrode 211 and the second gap electrode 212 proximate to each other are complementary. In this way, it may further increase the facing area between a whole of the first gap electrode 111 and the second gap electrode 112 and a whole of the third gap electrode 211 and the fourth gap electrode 212, so that the the facing area between the first touch electrode 11 and the second touch electrode 21 is increased, and in turn the mutual capacitance value between the first touch electrode 11 and the second touch electrode 21 is increased. For example, compared to the electrode arrangement structure shown in FIGS. 26A and 26B, in the embodiments of the present disclosure, the mutual capacitance value may be increased by 60% to 170%, such as 60%, 80%, 100%, 115%, 130%, 160% or 170%.

In some embodiments, the contour of the first gap electrode 111 is at least partially different from the contour of the first touch electrode 11 located in the non-gap region, and/or the contour of the second gap electrode 112 is at least partially different from the contour of the first touch electrode 11 located in the non-gap region.

For example, the contours of the first gap electrode 111 and the second gap electrode 112 shown in FIG. 10 are both at least partially different from the contour of the first touch electrode 11 located in the non-gap region. For example, the contours of the first gap electrode 111 and the second gap electrode 112 both have protrusions in a shape of a wave-shape, a rectangle and the like, while the contour of the first touch electrode 11 located in the non-gap region has stepped protrusions.

In some embodiments, as shown in FIG. 10, an average dimension of the first gap electrode 111 in the second direction Y gradually decreases in a direction from the first gap electrode 111 to the second gap electrode 112; and/or an average dimension of the second gap electrode 112 in the second direction Y gradually decreases in a direction from the second gap electrode 112 to the first gap electrode 111.

In some embodiments, the contour of the third gap electrode 211 is at least partially different from the contour of the second touch electrode 21 located in the non-gap region, and/or the contour of the fourth gap electrode 212 is at least partially different from the contour of the second touch electrode 21 located in the non-gap region.

For example, the contours of the third gap electrode 211 and the fourth gap electrode 212 shown in FIG. 10 are both at least partially different from the contour of the second touch electrode 21 located in the non-gap region. For example, the contour of the third gap electrode 211 has protrusions in various shapes, and the protrusions in various shapes include at least two shapes of wavy protrusions, rectangular protrusions, triangular protrusions and trapezoidal protrusions. The contour of the fourth gap electrode 212 has wavy protrusions, rectangular protrusions and the like, and the contour of the second touch electrode 21 located in the non-gap region has stepped protrusions.

In some examples, a height of the protrusions of the contour of the third gap electrode 211 is in a range of 280 μm to 400 μm, such as 280 μm, 300 μm, 320 μm, 350 μm, 360 μm, 390 μm, or 400 μm; and a width of the protrusions of the contour of the third gap electrode 211 is in a range of 260 μm to 300 μm, such as 260 μm, 270 μm, 280 μm, 290 μm or 300 μm.

Figure 13A:
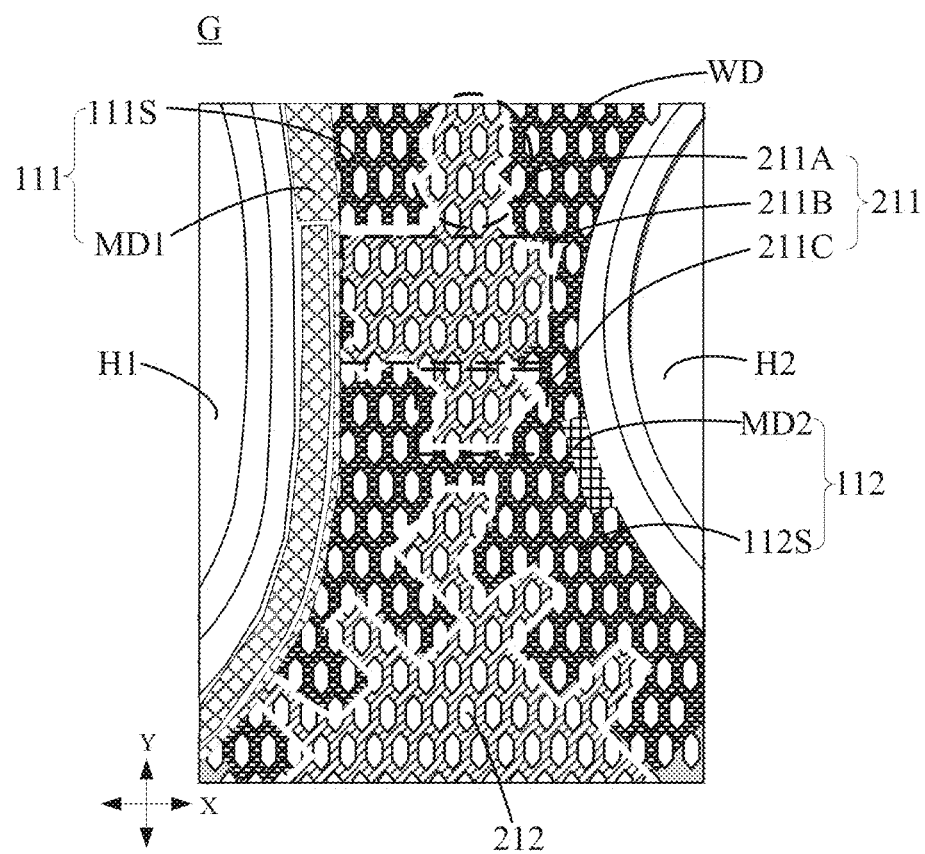
FIG. 13A is a structural diagram of a metal mesh of a touch electrode in a gap region, in accordance with some embodiments.

In some embodiments, as shown in FIG. 13A, the third gap electrode 211 includes a first portion 211A, a second portion 211B and a third portion 211C that are connected as a whole, the first portion 211A, the second portion 211B, and the third portion 211C are arranged in sequence in a direction from the third gap electrode 211 to the fourth gap electrode 212. Average dimensions of the first portion 211A and the third portion 211C in the first direction X are each less than an average dimension of the second portion 211B in the first direction X.

That is, in the second direction Y, and in the direction from the third gap electrode 211 to the fourth gap electrode 212, the dimension of a whole of the third gap electrode 211 in the first direction X has a tendency to change from small to large and then to small. The dimension changing from small to large is beneficial to increasing the contour perimeter of the third gap electrode 211, and the dimension changing from large to small is beneficial to be connected to the fourth gap electrode 212.

Figure 13B:
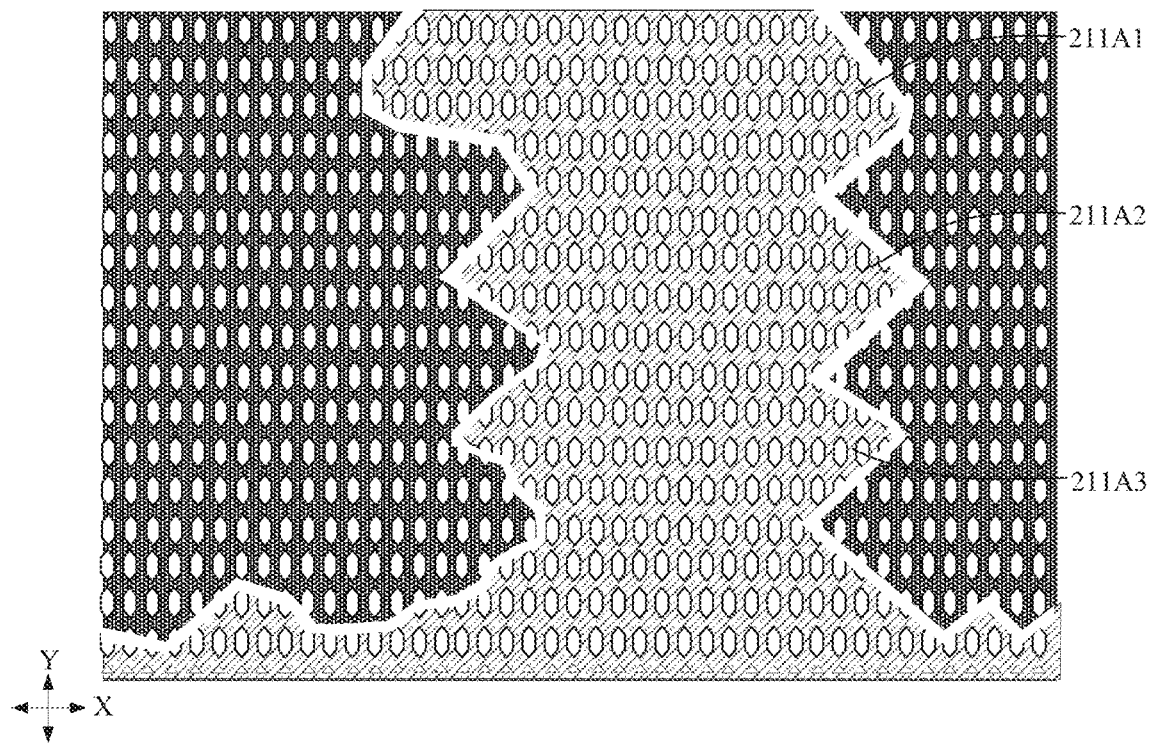
FIG. 13B is a structural diagram of a first portion of a third gap electrode in a gap region, in accordance with some embodiments.

For example, as shown in FIG. 13B, a portion of a contour of the first portion 211A proximate to the first gap electrode 111 and a portion of a contour of the first portion 211A proximate to the second gap electrode 112 both have a plurality of triangular protrusions. For example, the plurality of triangular protrusions includes a first protrusion 211A1, a second protrusion 211A2 and a third protrusion 211A3 that are arranged in sequence in a direction from the third gap electrode 211 to the fourth gap electrode 212. A height of the plurality of triangular protrusions in the first direction X is in a range of 89.3 μm to 91.2 μm, such as 89.3 μm, 90.7 μm, 91.0 μm, or 91.2 μm. A length of bottom sides of the plurality of triangular protrusions in the second direction Y is in a range of 180.0 μm to 206.9 μm, such as 180.0 μm, 192.0 μm, 200.7 μm, 202.8 μm, or 206.9 μm.

In some embodiments, as shown in FIGS. 10 and 13A, an average dimension of the fourth gap electrode 212 in the first direction X first decreases and then increases in a direction from the third gap electrode 211 to the fourth gap electrode 212.

Figure 11A:
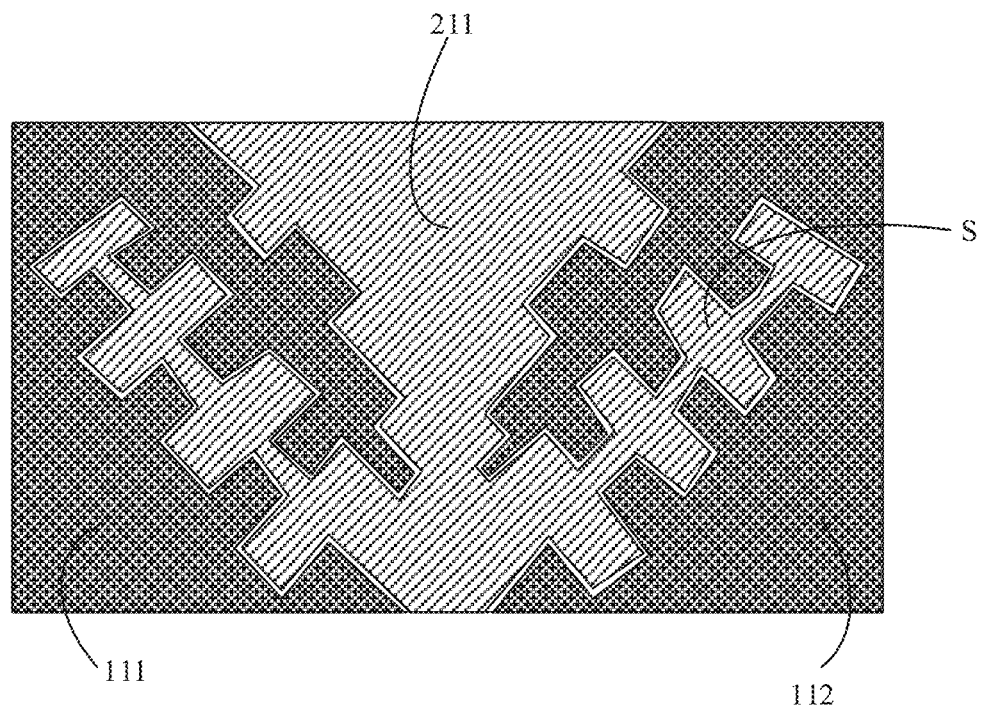
FIG. 11A is a structural diagram of branches of a third gap electrode, in accordance with some embodiments.
Figure 11B:
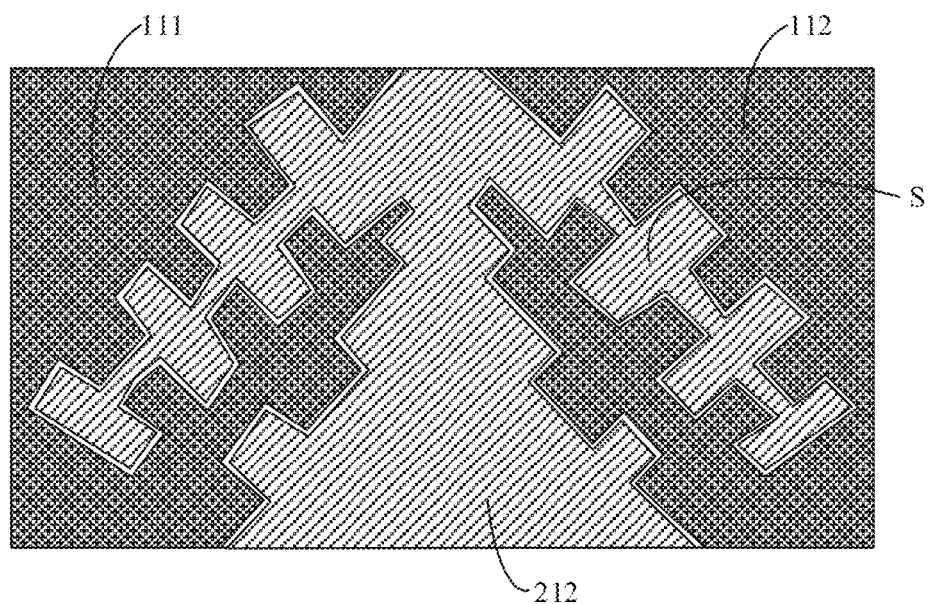
FIG. 11B is a structural diagram of branches of a fourth gap electrode, in accordance with some embodiments.

In some embodiments, as shown in FIGS. 11A and 11B, an edge of at least one of the third gap electrode 211 and the fourth gap electrode 212 has at least one branch S, and the edge is proximate to at least one of the first gap electrode 111 and the second gap electrode 112. The at least one branch S extends into a gap electrode(s) proximate to the edge where it is located, that is, the branch S extends into the first gap electrode 111 and/or the second gap electrode 112.

With the above arrangement, the facing area between the whole of the first gap electrode 111 and the second gap electrode 112 and the whole of the third gap electrode 211 and the fourth gap electrode 212 may be increased, so that the mutual capacitance value between the first touch electrode 11 and the second touch electrode 21 in the gap region G is further increased, and the situation of poor linearity of the drawn lines on the touch panel 100 in the gap region G is further improved.

For example, an edge of the third gap electrode 211 proximate to the first gap electrode 111 is provided with at least one branch S, and the at least one branch S extends into the inside of the first gap electrode 111. As shown in FIG. 11A, the edge of the third gap electrode 211 proximate to the first gap electrode 111 is provided with one branch S. In some other embodiments, the edge of the third gap electrode 211 proximate to the first gap electrode 111 may also be provided with two or more branches S.

For example, an edge of the third gap electrode 211 proximate to the second gap electrode 112 is provided with at least one branch S, and the at least one branch S extends into the inside of the second gap electrode 112. As shown in FIG. 11A, the edge of the third gap electrode 211 proximate to the second gap electrode 112 is provided with one branch S. In some other embodiments, the edge of the third gap electrode 211 proximate to the second gap electrode 112 may also be provided with two or more branches S.

The edge of the third gap electrode 211 proximate to the first gap electrode 111 and the edge of the third gap electrode 211 proximate to the second gap electrode 112 may both be provided with the branch(s) S, or only one of them may be provided with the branch(s) S.

As shown in FIG. 11A, in a case where the edges of the third gap electrode 211 proximate to the first gap electrode 111 and the second gap electrode 112 are both provided with the at least one branch S, the number of the branch(s) S provided at the edge of the third gap electrode 211 proximate to the first gap electrode 111 and the number of the branch(s) S provided at the edge of the third gap electrode 211 proximate to the second gap electrode 112 may be equal; and further, these branches S may be symmetrically arranged with respect to a bisector of the third gap electrode 211 in the second direction Y, which is beneficial to improve the accuracy of touch position detection.

For example, an edge of the fourth gap electrode 212 proximate to the first gap electrode 111 is provided with at least one branch S, and the at least one branch S extends into the inside of the first gap electrode 111. As shown in FIG. 11B, an edge of the fourth gap electrode 212 proximate to the first gap electrode 111 is provided with one branch S. In some other embodiments, the edge of the fourth gap electrode 212 proximate to the first gap electrode 111 may also be provided with two or more branches S.

For example, an edge of the fourth gap electrode 212 proximate to the second gap electrode 112 is provided with at least one branch S, and the at least one branch S extends into the inside of the second gap electrode 112. As shown in FIG. 11B, an edge of the fourth gap electrode 212 proximate to the second gap electrode 112 is provided with one branch S. In some other embodiments, the edge of the fourth gap electrode 212 proximate to the second gap electrode 112 may also be provided with two or more branches S.

The edge of the fourth gap electrode 212 proximate to the first gap electrode 111 and the edge of the fourth gap electrode 211 proximate to the second gap electrode 112 may both be provided with the branch(es) S, or only one of them may be provided with the branch(es) S.

As shown in FIG. 11B, in a case where the edges of the fourth gap electrode 212 proximate to the first gap electrode 111 and the second gap electrode 112 are both provided with the at least one branch S, the number of the branch(s) S provided at the edge of the fourth gap electrode 212 proximate to the first gap electrode 111 and the number of the branch(s) S provided at the edge of the fourth gap electrode 212 proximate to the second gap electrode 112 may be equal; and further, these branches S may be symmetrically arranged with respect to a bisector of the fourth gap electrode 212 in the second direction Y, which is beneficial to improve the accuracy of touch position detection.

In some embodiments, as shown in FIGS. 11A and 11B, edges of the branches S provided in the third gap electrode 211 and the fourth gap electrode 212 may be zigzag-shaped. The zigzag-shaped branches S may further increase the facing area between adjacent gap electrodes, so that the mutual capacitance value between the first touch electrode 11 and the second touch electrode 21 in the gap region G is further increased, and the linearity of the drawn lines of the touch panel 100 in the gap region G is improved.

It will be noted that, shapes and positions of the branches S of the third gap electrode 211 and the fourth gap electrode 212 shown in FIGS. 11A and 11B are only illustrative, and the shapes and the positions of the branches S are not limited herein. The branches S may be disposed in any position of the edges of the third gap electrode 211 and the fourth gap electrode 212 that are proximate to the first gap electrode 111 and the second gap electrode 112, as long as the facing area between adjacent gap electrodes may be increased.

In some embodiments, touch electrodes in the touch panel 100 employ a structure of metal mesh. Compared with planar electrodes form by indium tin oxide (ITO) as touch electrodes, touch electrodes with the structure of metal mesh have low resistance and high sensitivity, so that a touch sensitivity of the touch panel 100 may be improved. Moreover, the touch electrodes with the structure of metal mesh have high mechanical strength, so that a weight of the touch panel 100 may be reduced. Therefore, the display apparatus may be made light and thin in a case where the touch panel 100 is applied to the display apparatus.

It will be noted that, the touch electrodes with the structure of metal mesh include the first touch electrodes 11 and the second touch electrodes 21 in the touch panel 100. The first touch electrodes 11 include first touch electrodes 11 in the normal region C, first touch electrodes 11 in the gap region G for forming the first gap electrode(s) 111 and the second gap electrode(s) 112, and first touch electrode(s) 11 in the hole edge region KB for forming hole edge electrode(s). The second touch electrodes 21 include second touch electrodes 21 in the normal region C, second touch electrodes 21 in the gap region G for forming the third gap electrode(s) 211 and the fourth gap electrode(s) 212, and second touch electrode(s) 21 in the hole edge region KB for forming hole edge electrode(s).

Figure 12:
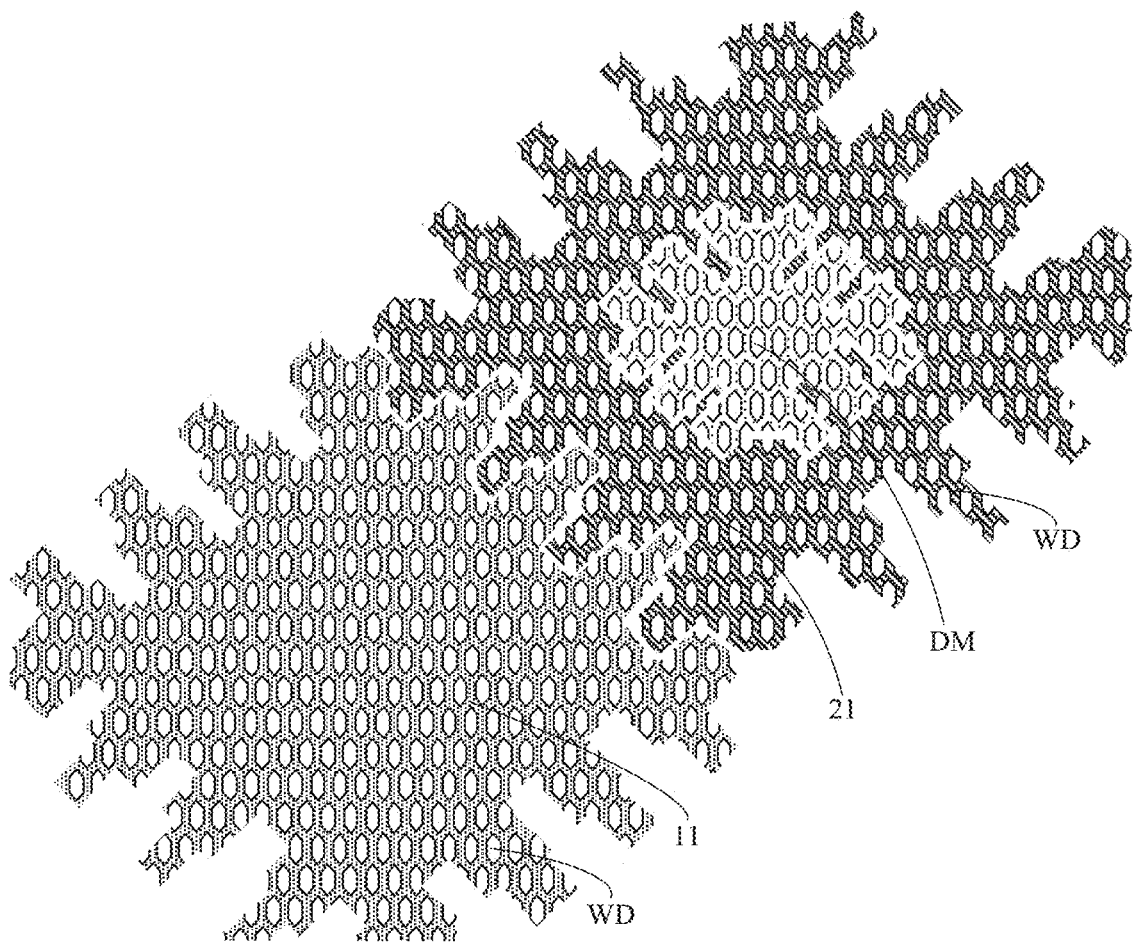
FIG. 12 is a structural diagram of a metal mesh of a touch electrode in a region shown in the dotted box F in FIG. 10.

In some embodiments, as shown in FIG. 12, the first touch electrode 11 and the second touch electrode 21 each employ a structure of metal mesh. The metal meshes WD of the first touch electrode 11 and the second touch electrode 21 are disposed in a touch electrode layer 2A, and the metal mesh WD of the first touch electrode 11 and the metal mesh WD of the second touch electrode 21 are disconnected, so that the first touch electrode 11 and the second touch electrode 21 are insulated from each other.

It will be noted that, the metal meshes WD in FIG. 12 are filled with different patterns to distinguish different touch electrodes. The metal meshes WD of the first touch electrode 11 and the second touch electrode 21 may be formed by the same material and the same process.

As shown in FIG. 13A, in the gap region G, the first gap electrode 111, the second gap electrode 112, the third gap electrode 211, and the fourth gap electrode 212 employ a structure of metal mesh. In some embodiments, a line width of the metal mesh WD in the gap region G may be greater than a line width of the metal mesh WD in the normal region C, so that areas of the first touch electrode 11 and the second touch electrode 21 located in the gap region G may be compensated. As a result, areas of electrodes, for transmitting touch signals, in the first touch electrode 11 and the second touch electrode 21 in the gap region G are increased, and the mutual capacitance value between the first touch electrode 11 and the second touch electrode 21 is increased, so that the situation of poor linearity of the drawn lines on the touch panel 100 in the gap region G may be further improved.

It will be noted that, in a case where the line width of the metal mesh WD in the gap region G is greater than the line width of the metal mesh WD in the normal region C, an area of openings of the metal mesh WD in the gap region G is less than an area of openings of the metal mesh WD in the normal region C.

For example, the line width of the metal mesh WD in the normal region C is 2.8 μm to 4.2 μm, such as 2.8 μm, 3.0 μm, 3.5 μm, 3.8 μm, 4.0 μm, or 4.2 μm. The line width of the metal mesh WD in the gap region G is 3.8 μm to 5.2 μm, such as 3.8 μm, 4.0 μm, 4.5 μm, 4.8 μm, 5.0 μm or 5.2 μm.

Figure 14A:
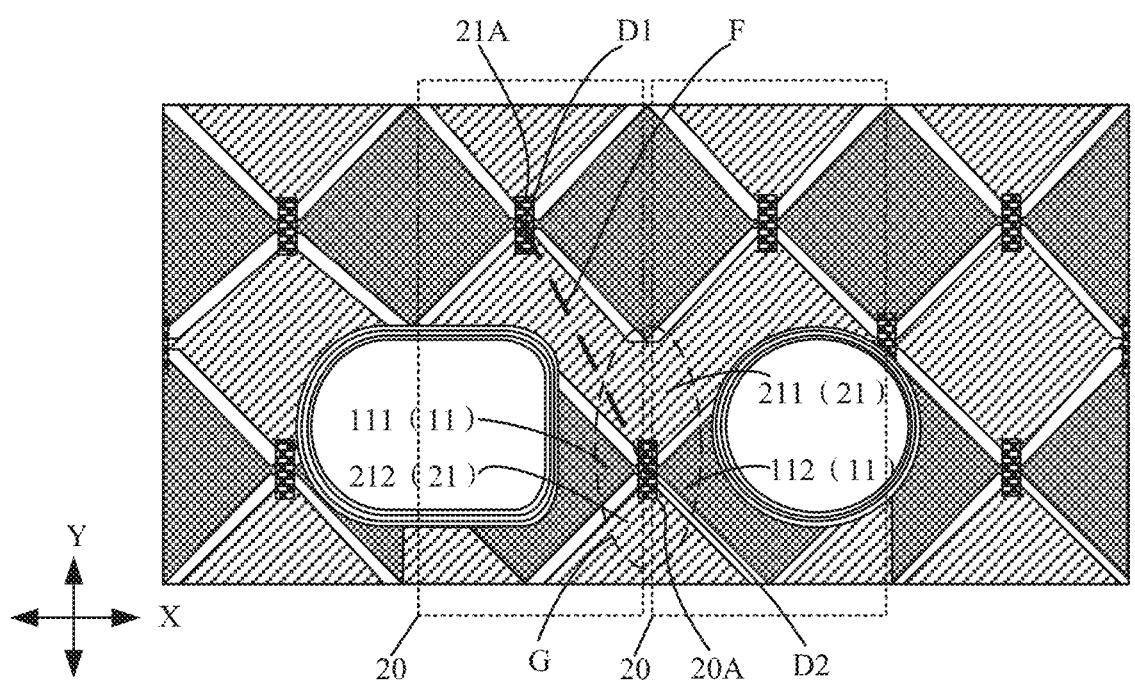
FIG. 14A is a simplified top view of a hole edge region and a gap region of a touch panel, in accordance with some embodiments.
Figure 14B:
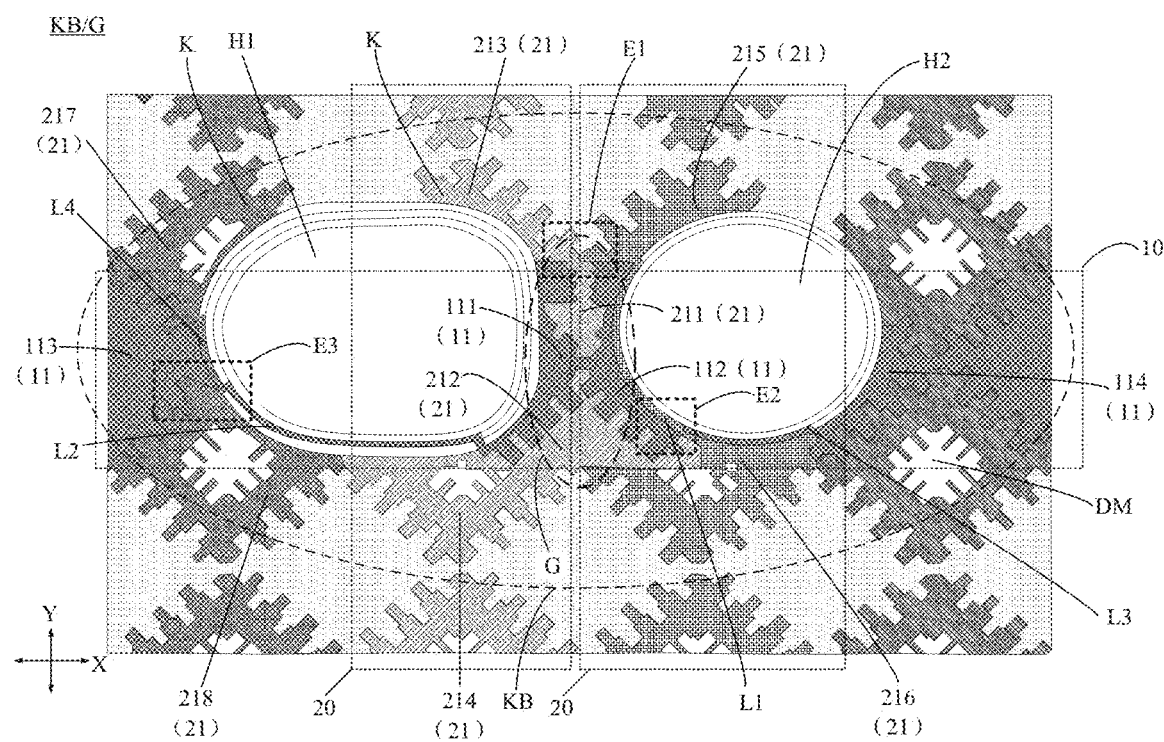
FIG. 14B is a specific top view of a hole edge region and a gap region of a touch panel, in accordance with some embodiments.

In some embodiments, as shown in FIG. 14B, in each touch unit passing through the first mounting hole H1 and the second mounting hole H2, each touch electrode located in the hole edge region KB forms a hole edge electrode K. Since a portion, at a position of the mounting hole H, of the hole edge electrode K is missing, an area of a single hole edge electrode K is less than an area of a single touch electrode located in the normal region C.

It will be noted that, only some hole edge electrodes K are shown in FIG. 14B as a schematic. It will be understood that, in each touch unit passing through at least two mounting holes H, each touch electrode located in the hole edge region KB forms a hole edge electrode K, so that a plurality of hole edge electrodes K distributed around the mounting holes H. In the hole edge region KB, since the area of the hole edge electrode K is less than the area of the touch electrode in the normal region C, there is a difference between a mutual capacitance value generated by the hole edge electrodes K in the hole edge region KB and a mutual capacitance value generated by the touch electrodes in the normal region C. When a finger draws a line on the touch panel 100 passing through the hole edge region KB, the drawn line may become deformed in the hole edge region KB, for example, be curved or even broken, which results in poor linearity of the drawn line on the touch panel 100.

Based on this, in some embodiments, a line width of the metal mesh WD of the hole edge electrode K in the hole edge region KB is greater than a line width of the metal mesh WD of the touch electrode in the normal region C, so that the area of the hole edge electrode K located in the hole edge region KB may be compensated, and an area of the hole edge electrode K for transmitting a touch signal in the hole edge region KB may be increased. As a result, the mutual capacitance value generated by hole edge electrodes K in the hole edge region KB is increased, so that the situation of poor linearity of the drawn lines on the touch panel 100 in the hole edge region KB may be improved.

Furthermore, the line width of the metal mesh WD in the hole edge region KB may be equal to the line width of the metal mesh WD in the gap region G.

In some embodiments, in the gap region G, at a position proximate to a corresponding mounting hole H, at least one of gap electrodes (the gap electrodes including the first gap electrode 111, the second gap electrode 112, the third gap electrode 211, and the fourth gap electrode 212) is provided with a compensation sub-electrode. The compensation sub-electrode is a planar electrode, and the compensation sub-electrode is electrically connected to other portions of the gap electrode. It will be noted that, the term "corresponding mounting hole" refers to a mounting hole H closest to the gap electrode.

By providing the compensating sub-electrode, it is possible to increase an area of an electrode, for transmitting a touch signal, in the gap electrode, thereby increasing the mutual capacitance value between the gap electrodes in the gap region G.

In addition, the compensation sub-electrode is arranged at a position closest to the mounting hole H; therefore, it is possible to avoid the influence on the display effect due to a fact that the planar compensation sub-electrode blocks light in the case where the touch panel 100 is applied to a display apparatus.

Figure 16:
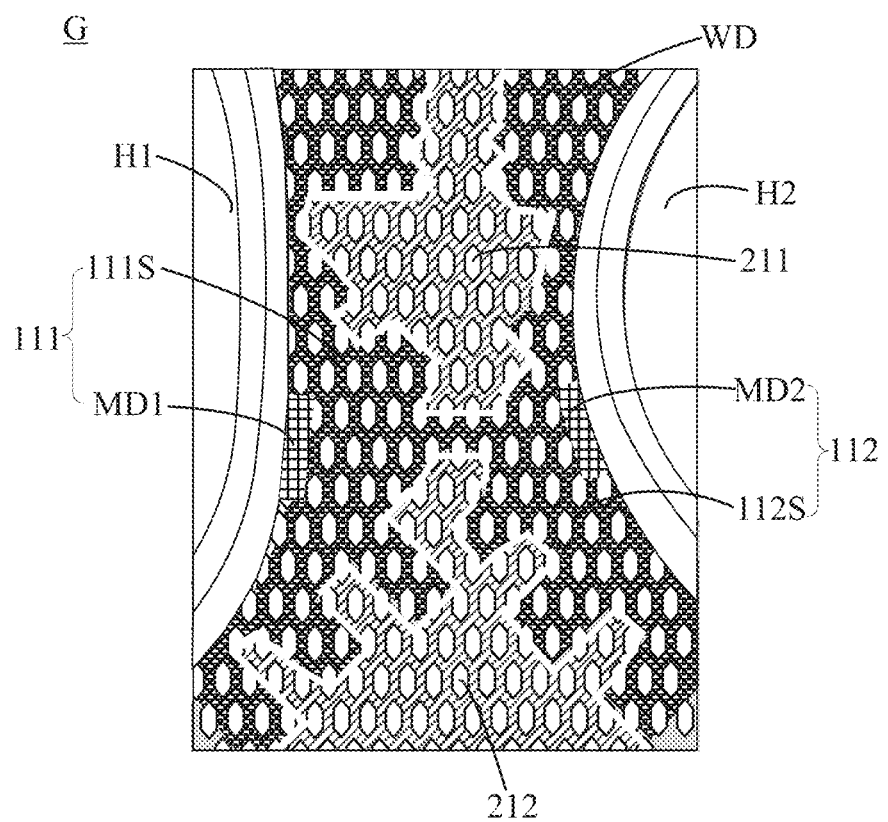
FIG. 16 is a structural diagram of a compensation sub-electrode in a gap region of a touch panel, in accordance with some embodiments.

For example, as shown in FIG. 16, the first gap electrode 111 includes a first main sub-electrode 111S and a first compensation sub-electrode MD1 that is disposed proximate to the first mounting hole H1. The first main sub-electrode 111S has a structure of metal mesh, the first compensation sub-electrode MD1 is a planar electrode, and the first main sub-electrode 111S is electrically connected to the first compensation sub-electrode MD1.

The second gap electrode 112 includes a second main sub-electrode 112S and a second compensation sub-electrode MD2 that is disposed proximate to the second mounting hole H2. The second main sub-electrode 112S has a structure of metal mesh, the second compensation sub-electrode MD2 is a planar electrode, and the second main sub-electrode 112S is electrically connected to the second compensation sub-electrode MD2.

It will be noted that, FIG. 16 only shows a case where the first gap electrode 111 and the second gap electrode 112 are each provided with a compensation sub-electrode therein, but the embodiments of the present disclosure is not limited thereto. In some other embodiments, a compensation sub-electrode may be provided in the first gap electrode 111, and no compensation sub-electrode may be provided in the second gap electrode 112; or it may be that no compensation sub-electrode is provided in the first gap electrode 111, and a compensation sub-electrode is provided in the second gap electrode 112.

A ratio of a sum of areas of the third gap electrode 211 and the fourth gap electrode 212 to a sum of an area of the metal mesh of the first main sub-electrode 111S, an area of the first compensation sub-electrode MD1, an area of the metal mesh of the second main sub-electrode 112S and an area of the second compensation sub-electrode MD2 is less than 1.3 and greater than or equal to 1. For example, the ratio may be 1, 1.05, 1.1, 1.15, or 1.2.

The first main sub-electrode 111S is electrically connected to the first compensation sub-electrode MD1, and the second main sub-electrode 112S is electrically connected to the second compensation sub-electrode MD2, which may further increase the areas of the first gap electrode 111 and the second gap electrode 112. Therefore, a difference between a sum of the areas of the first gap electrode 111 and the second gap electrode 112 and a sum of the areas of the third gap electrode 211 and the fourth gap electrode 212 is reduced, which is beneficial to increase the facing area between the first touch electrode 11 and the second touch electrode 21 in the gap region G.

A ratio of a sum of the area of the metal mesh of the first main sub-electrode 111S included in the first gap electrode 111 and the area of the planar electrode of the first compensation sub-electrode MD1 included in the first gap electrode 111 to an area of the metal mesh of the first touch electrode 11 in the normal region C is in a range of 65% to 100%, such as 65%, 70%, 80%, 90%, or 100%.

In the case where the first gap electrode 111 includes the first main sub-electrode 111S and the first compensation sub-electrode MD1, the area of the metal mesh of the first main sub-electrode 111S is in a range of $8.0 \times 10^6$ μm$^2$ to $1.0 \times 10^7$ μm$^2$ such as $8.0 \times 10^6$ μm$^2$, $8.5 \times 10^6$ μm$^2$, $9.0 \times 10^6$ μm$^2$, $9.04 \times 10^6$ μm$^2$ or $1.0 \times 10^7$ μm$^2$; and the area of the planar electrode of the first compensation sub-electrode MD1 is in a range of $2.0 \times 10^5$ μm$^2$ to $4.0 \times 10^5$ μm$^2$, such as $2.0 \times 10^5$ μm$^2$, $2.5 \times 10^5$ μm$^2$, $3.0 \times 10^5$ μm$^2$, $3.8 \times 10^5$ μm$^2$ or $4.0 \times 10^5$ μm$^2$.

In the case where the second gap electrode 112 includes the second main sub-electrode 112S and the second compensation sub-electrode MD2, a ratio of a sum of the area of the metal mesh of the second main sub-electrode 112S and the area of the planar electrode of the second compensation sub-electrode MD2 to an area of the metal mesh of the second touch electrode 21 in the normal region C is in a range of 65% to 100%, such as 65%, 70%, 80%, 90%, or 100%.

In the case where the second gap electrode 112 includes the second main sub-electrode 112S and the second compensation sub-electrode MD2, the area of the metal mesh of the second main sub-electrode 112S is in a range of $7.0 \times 10^6$ μm$^2$ to $9.0 \times 10^6$ μm$^2$, such as $7.0 \times 10^6$ μm$^2$, $7.76 \times 10^6$ μm$^2$, $8.0 \times 10^6$ μm$^2$ or $9.0 \times 10^6$ μm$^2$; and the area of the planar electrode of the second compensation sub-electrode MD2 is in a range of $2.0 \times 10^5$ μm$^2$ to $3.0 \times 10^5$ μm$^2$, such as $2.0 \times 10^5$ μm$^2$, $2.3 \times 10^5$ μm$^2$, $2.5 \times 10^5$ μm$^2$, $2.8 \times 10^5$ μm$^2$ or $3.0 \times 10^5$ μm$^2$.

It will be noted that, "the area of the metal mesh of the first main sub-electrode 111S" refers to an area of a region enclosed by a contour of the metal mesh of the first main sub-electrode 111S; similarly, the same is true for the area of the metal mesh of the second main sub-electrode 112S.

In some embodiments, the hole edge electrode K located in the hole edge region KB includes a main sub-electrode and a compensation sub-electrode that is disposed proximate to a corresponding mounting hole H. It will be noted that, the term "corresponding mounting hole" refers to a mounting hole H closest to the hole edge electrode K.

The main sub-electrode of the hole edge electrode K may have a structure of metal mesh, the compensation sub-electrode of the hole edge electrode K may be a planar electrode, and the main sub-electrode is electrically connected to the compensation sub-electrode, so as to compensate an area of the hole edge electrode K for transmitting a touch signal and increase the mutual capacitance value between the hole edge electrodes K in the hole edge region KB, thereby further improving the accuracy of touch position sensing in the hole edge region KB, and improving the linearity of the drawn line.

In a case where the touch panel 100 is in a shape of a rectangle, since lengths of long sides and short sides are different, a sum of areas of electrodes of a touch unit extending in a long side direction is greater than a sum of areas of electrodes of a touch unit extending in a short side direction, which affects a mutual capacitance value generated between the touch unit extending in the long side direction and the touch unit extending in the short side direction, and further affects the accuracy of touch position sensing.

Based on this, in some embodiments, a touch electrode of the touch unit extending in the long side direction is provided with a dummy electrode that is disconnected from the touch electrode, and the dummy electrode is not electrically connected to the touch electrode, so that the dummy electrode do not transmit a touch signal, and a sum of areas of electrodes, for transmitting the touch signal, of the touch unit extending in the long side direction is reduced. As a result, a difference between the sum of areas of the electrodes, for transmitting the touch signal, of the touch unit extending in the long side direction and the sum of areas of electrodes, for transmitting the touch signal, of the touch unit extending in the short side direction is reduced, and the two may even be approximately equal. Therefore, a problem that the mutual capacitance value between different touch units are affected due to a difference between areas of electrodes, for transmitting signals, in touch units extending in different directions in the touch panel 100 may be avoided, and the accuracy of touch position sensing is improved.

For example, as shown in FIGS. 10, 12 and 14B, in a case where the touch panel 100 is in a shape of a rectangle, the first direction X is the short side direction, and the second direction Y is the long side direction, a dummy electrode DM disconnected from the metal mesh WD for transmitting the signal is provided in the second touch electrode 21 in the second touch unit extending in the second direction Y. For example, the dummy electrode DM may also adopt a structure of metal mesh, so as to ensure the display uniformity of the display apparatus to which the touch panel 100 is applied.

In some other embodiments, in a case where the touch panel 100 is in a shape of a rectangle, the first direction X is the long side direction, and the second direction Y is the short side direction, a dummy electrode DM disconnected from the metal mesh WD for transmitting the signal is provided in the first touch electrode 11 in the first touch unit extending in the first direction X.

A connection relationship between the touch electrodes in the hole edge region KB and the gap region G will be described below with reference to FIG. 14B.

In some embodiments, as shown in FIG. 14B, in a first touch unit 10 passing through the first mounting hole H1 and the second mounting hole H2 in the first direction X, a first touch electrode 11 located at a side of the first mounting hole H1 away from the second mounting hole H2 forms a fifth hole edge electrode 113, and a first touch electrode 11 located at a side of the second mounting hole H2 away from the first mounting hole H1 forms a sixth hole edge electrode 114.

In a second touch unit 20 passing through the first mounting hole H1, two second touch electrodes 21 located at both sides of the first mounting hole H1 in the second direction Y form a first hole edge electrode 213 and a second hole edge electrode 214. In a second touch unit 20 passing through the second mounting hole H2, two second touch electrodes 21 located at both sides of the second mounting hole H2 in the second direction Y form a third hole edge electrode 215 and a fourth hole edge electrode 216.

In some embodiments, as shown in FIG. 14B, the first hole edge electrode 213, the third gap electrode 211, the fourth gap electrode 212, and the second hole edge electrode 214 are electrically connected in sequence, so that the second touch electrodes 21 in the second touch unit 20 passing through the first mounting hole H1 are electrically connected.

Figure 15:
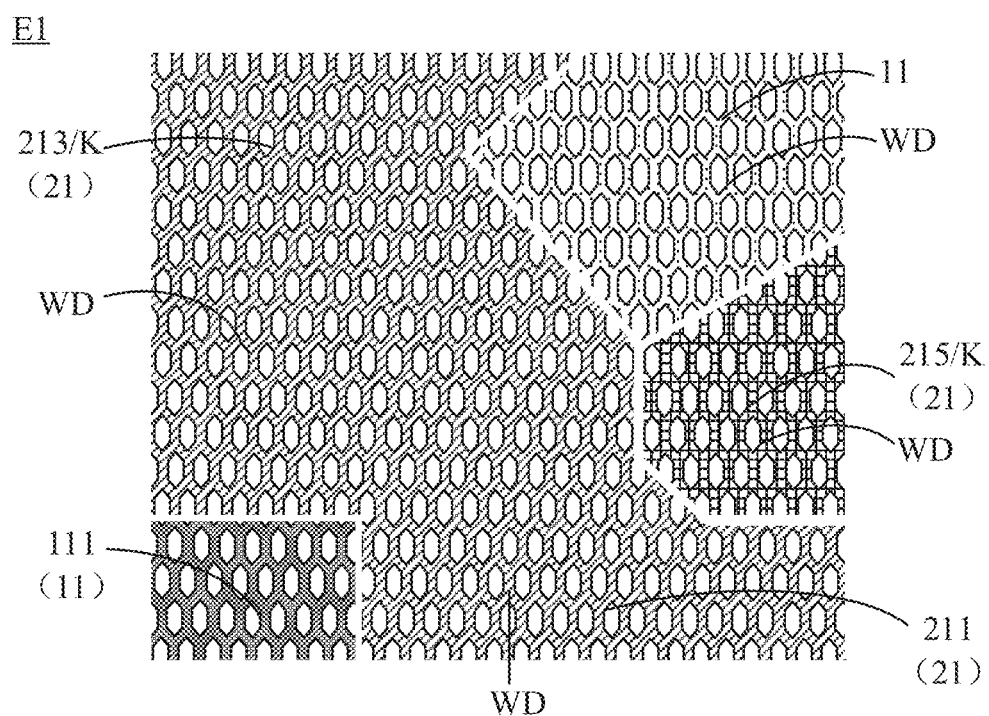
FIG. 15 is a partial enlarged view of a structure of metal mesh in a region shown in the dotted box E1 in FIG. 14B.

As shown in FIG. 15, the first hole edge electrode 213 and the third gap electrode 211 may be directly electrically connected, for example, the two may be formed as an integrated structure.

As shown in FIG. 14B, the fourth gap electrode 212 and the second hole edge electrode 214 may be directly electrically connected, for example, the two may be formed as an integrated structure.

Figure 17:
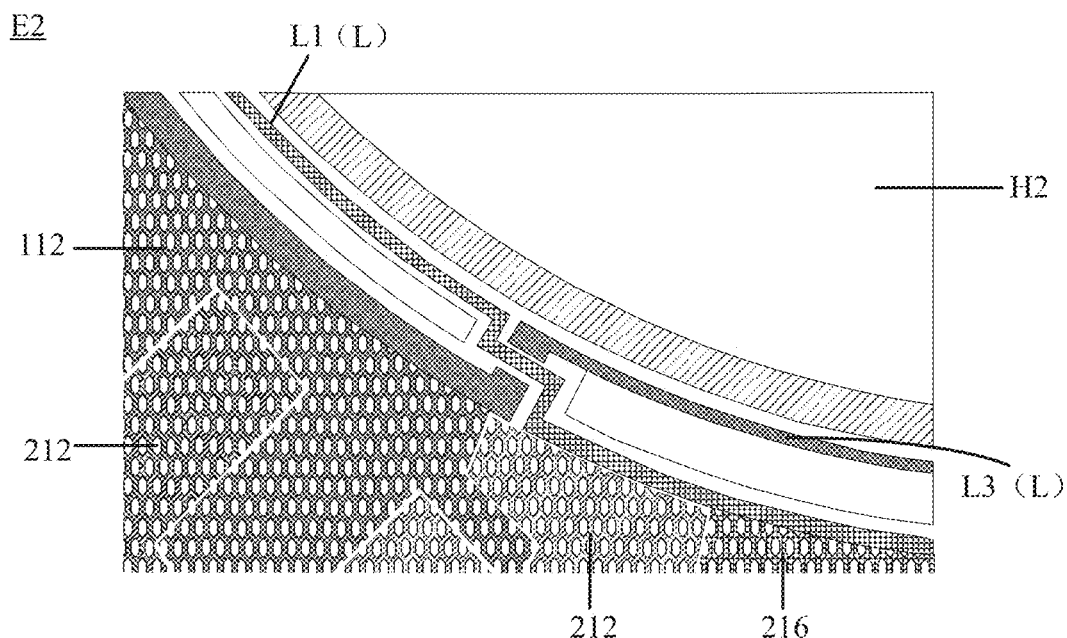
FIG. 17 is a partial enlarged view of a region shown in the dotted box E2 in FIG. 14B.

As shown in FIGS. 14B and 17, the third hole edge electrode 215 and the fourth hole edge electrode 216 are electrically connected by a first connection line L1, and the first connection line L1 extends along the contour of the second mounting hole H2, so that the second touch electrodes 21 in the second touch unit 20 passing through the second mounting hole H2 are electrically connected.

Figure 18:
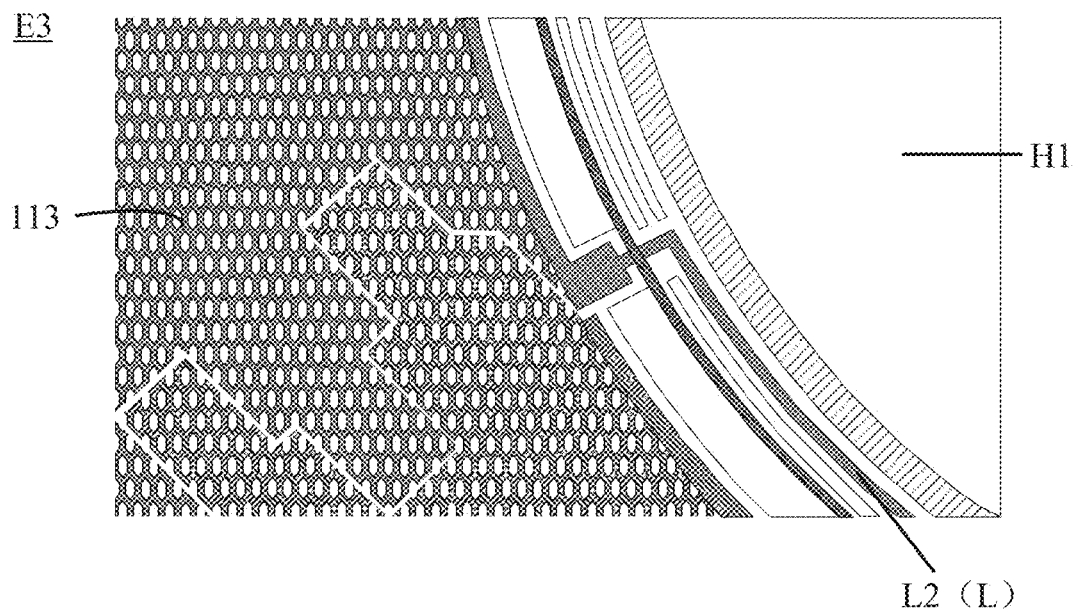
FIG. 18 is a partial enlarged view of a region shown in the dotted box E3 in FIG. 14B.

As shown in FIGS. 14B and 18, the first gap electrode 111 and the fifth hole edge electrode 113 are electrically connected by a second connection line L2, and the second connection line L2 extends along the contour of the first mounting hole H1. As shown in FIGS. 14B and 17, the second gap electrode 112 and the sixth hole edge electrode 114 are electrically connected through a third connection line L3, and the third connection line L3 extends along the contour of the second mounting hole H2, so that the first touch electrodes 21 in the first touch unit 10 passing through the first mounting hole H1 and the second mounting hole H2 are electrically connected.

Based on the above structure, an arrangement position of the first connection line L1 crosses an arrangement position of the third connection line L3. Therefore, referring to FIG. 3, the first connection line L1 and the third connection line L3 are located in different layers in the touch function layer at least at the crossing position. That is, at the crossing position, one of the first connection line L1 and the third connection line L3 is located in a touch electrode layer 2A in the touch function layer 2, the other of the first connection line L1 and the third connection line L3 is located in a bridge structure layer 2C in the touch function layer 2, and the first connection line L1 and the third connection line L3 are separated by an insulating layer 2B in the touch function layer 2 at the crossing position to prevent crosstalk of touch signals transmitted on the first connection line L1 and the third connection line L3.

For example, the first connection line L1 is disposed in the bridge structure layer 2C, and the first connection line L1 is electrically connected to the third hole edge electrode 215 and the fourth hole edge electrode 216 through different via holes 2BK penetrating through the insulating layer 2B. The third connection line L3 is disposed in the touch electrode layer 2A, and the third connection line L3 is directly electrically connected to the sixth hole side electrode 114 and the second gap electrode 112.

For example, the first connection line L1 is disposed in the touch electrode layer 2A, and the first connection line L1 is directly electrically connected to the third hole edge electrode 215 and the fourth hole edge electrode 216. The third connection line L3 is disposed in the bridge structure layer 2C, and the third connection line L3 is electrically connected to the sixth hole edge electrode 114 and the second gap electrode 112 through different via holes 2BK penetrating through the insulating layer 2B.

In some embodiments, the second connection line L2 may be disposed in the touch electrode layer 2A or the bridge structure layer 2C. In a case where the second connection line L2 is disposed in the touch electrode layer 2A, the second connection line L2 is directly electrically connected to the fifth hole edge electrode 113 and the first gap electrode 111. In a case where the second connection line L2 is disposed in the bridge structure layer 2C, the second connection line L2 is electrically connected to the first gap electrode 111 and the fifth hole edge electrode 113 through different via holes 2BK penetrating through the insulating layer 2B.

A whole formed by electrically connecting the first hole edge electrode 213, the third gap electrode 211, the fourth gap electrode 212 and the second hole edge electrode 214 is insulated from a whole formed by electrically connecting the third hole edge electrode 215, the fourth hole edge electrode 216 and the first connection line L1, so that different touch units to which they respectively belong are insulated from each other.

Figure 19:
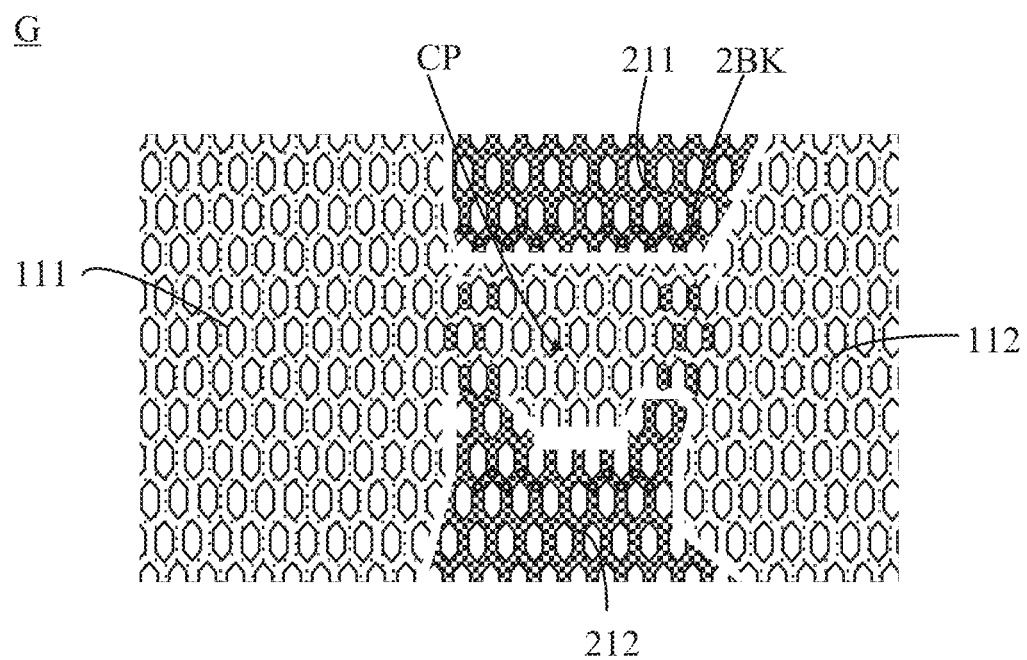
FIG. 19 is a structural diagram of a metal mesh of a touch electrode in a gap region of a touch panel, in accordance with some embodiments.

As shown in FIG. 19, in the gap region G, the first gap electrode 111 is electrically connected to the second gap electrode 112, the third gap electrode 211 is electrically connected to the fourth gap electrode 212, and a position where the first gap electrode 111 is in contact with the second gap electrode 112 and a position where a structure connecting the third gap electrode 211 and the fourth gap electrode 212 is located overlap with each other. A whole formed by electrically connecting the first gap electrode 111 and the second gap electrode 112 belongs to the first touch unit 10, a whole formed by electrically connecting the third gap electrode 211 and the fourth gap electrode 212 belongs to the second touch unit 20, and the signals transmitted on the first touch unit 10 and the second touch unit 20 are different, therefore the whole formed by electrically connecting the first gap electrode 111 and the second gap electrode 112 needs to be insulated from the whole formed by electrically connecting the third gap electrode 211 and the fourth gap electrode 212.

In some embodiments, referring to FIG. 14A, the third gap electrode 211 is electrically connected to the fourth gap electrode 212 by a bridge structure in the gap region G. In the second touch units 20 passing through the gap region G, an extension direction of a line F connecting a center D1 of any bridge structure (e.g., first bridge structure 21A) located in the non-gap region and a center D2 of a bridge structure (e.g., gap bridge structure 20A) for connecting the third gap electrode 211 and the fourth gap electrode 212 intersects with the second direction Y.

Compared with the bridge structures 21A' that are arranged in a second direction Y' in FIG. 26A, in the above-mentioned embodiments of the present disclosure, in the second touch units 20 passing through the gap region G, the extension direction of the line F connecting the center D1 of any bridge structure (e.g., first bridge structure 21A) located in the non-gap region and the center D2 of the bridge structure (e.g., gap bridge structure 20A) for connecting the third gap electrode 211 and the fourth gap electrode 212 intersects with the second direction Y, it is possible to satisfy the design of adopting the above-mentioned electrode arrangement structure in the gap region G.

In some embodiments, as shown in FIG. 3, the touch function layer 2 includes a touch electrode layer 2A, an insulating layer 2B, and a bridge structure layer 2C stacked on the base substrate 1. The insulating layer 2B is located between the touch electrode layer 2A and the bridge structure layer 2C, and the bridge structure layer 2C is located on a side of the touch electrode layer 2A proximate to or away from the base substrate 1. FIG. 3 shows a case where the bridge structure layer 2C is located on the side of the touch electrode layer 2A away from the base substrate 1.

Figure 4:
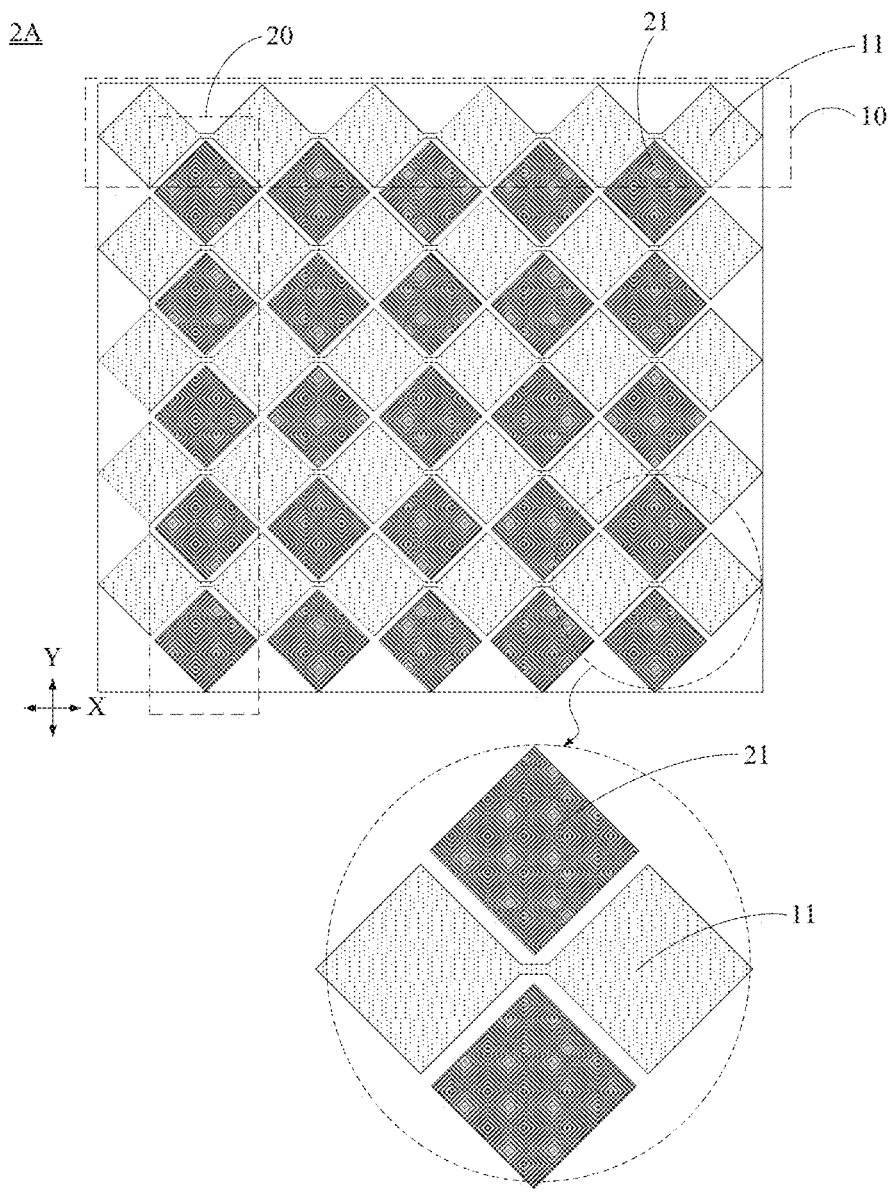
FIG. 4 is a top view of a touch electrode layer in a touch function layer, in accordance with some embodiments.

As shown in FIG. 3, the first touch electrodes 11 and the second touch electrodes 21 are disposed in the touch electrode layer 2A. As shown in FIG. 4, in the first direction X, every two adjacent first touch electrodes 11 are directly electrically connected, and in the second direction Y, every two adjacent second touch electrodes 21 are disposed separately from each other.

As shown in FIG. 3, the insulating layer 2B has a plurality of via holes 2BK.

Figure 5:
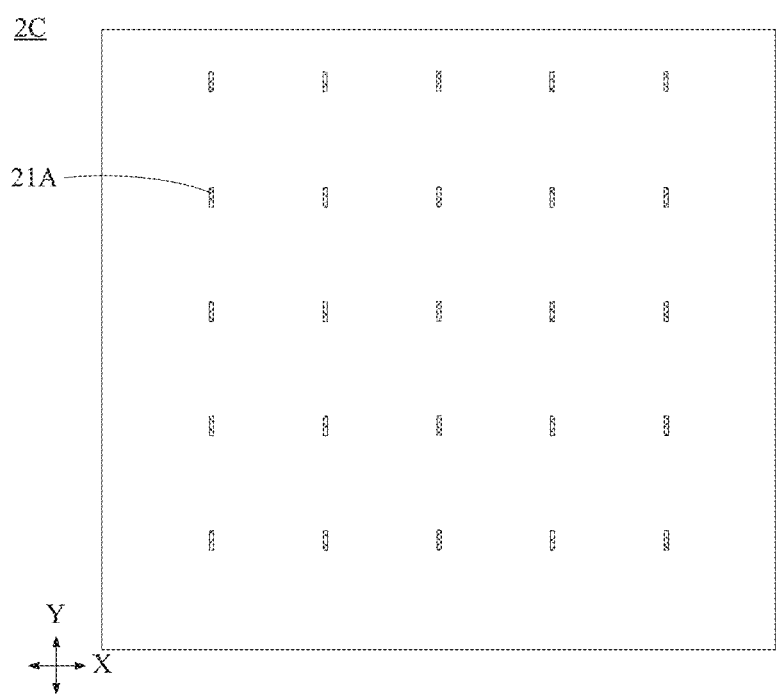
FIG. 5 is a top view of a bridge structure layer in a touch function layer, in accordance with some embodiments.

As shown in FIG. 5, a plurality of bridge structures (i.e., the first bridge structures 21A) included in each second touch unit 20 are disposed in the bridge structure layer 2C. As shown in FIGS. 2 and 3, in the second direction Y, every two adjacent second touch electrodes 21 are electrically connected to a first bridge structure 21A through different via holes 2BK penetrating through the insulating layer 2B, so that the second touch electrodes 21 included in the second touch unit 20 are electrically connected in the second direction Y.

It will be noted that, FIGS. 2 to 5 only illustrate examples in which the bridge structure layer 2C is located on the side of the touch electrode layer 2A away from the base substrate 1, but the embodiments of the present disclosure do not limited thereto. In some other embodiments, in the touch function layer 2 of the touch panel 100, the bridge structure layer 2C is located on the side of the touch electrode layer 2A proximate to the base substrate 1.

For a case where any two first touch electrodes 11 in the first touch unit 10 are directly electrically connected, and any two second touch electrodes 21 in the second touch unit 20 may be electrically connected through a first bridge structure 21A, as shown in FIG. 5, each first bridge structure 21A may extend in the second direction Y, so as to connect two second touch electrodes 21 on both sides thereof.

In some other embodiments, as shown in FIGS. 6 to 9, in the touch panel 100, it may also be that any two adjacent second touch electrodes 21 in the second touch unit 20 are directly electrically connected, and any two adjacent first touch electrodes 11 in the first touch unit 10 are electrically connected through a second bridge structure 11A disposed in the bridge structure layer 2C'.

Figure 7:
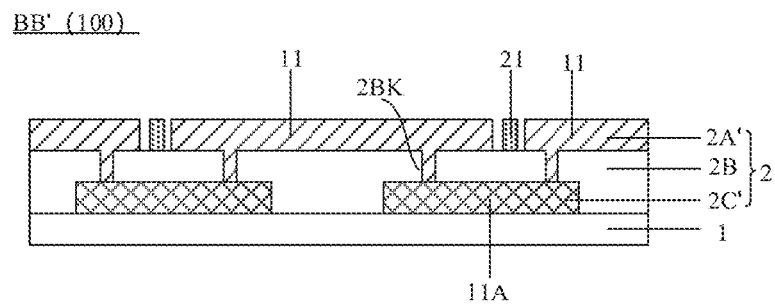
FIG. 7 is a sectional view of a touch panel taken along the cutting plane line BB' in FIG. 6, in accordance with some embodiments.
Figure 8:
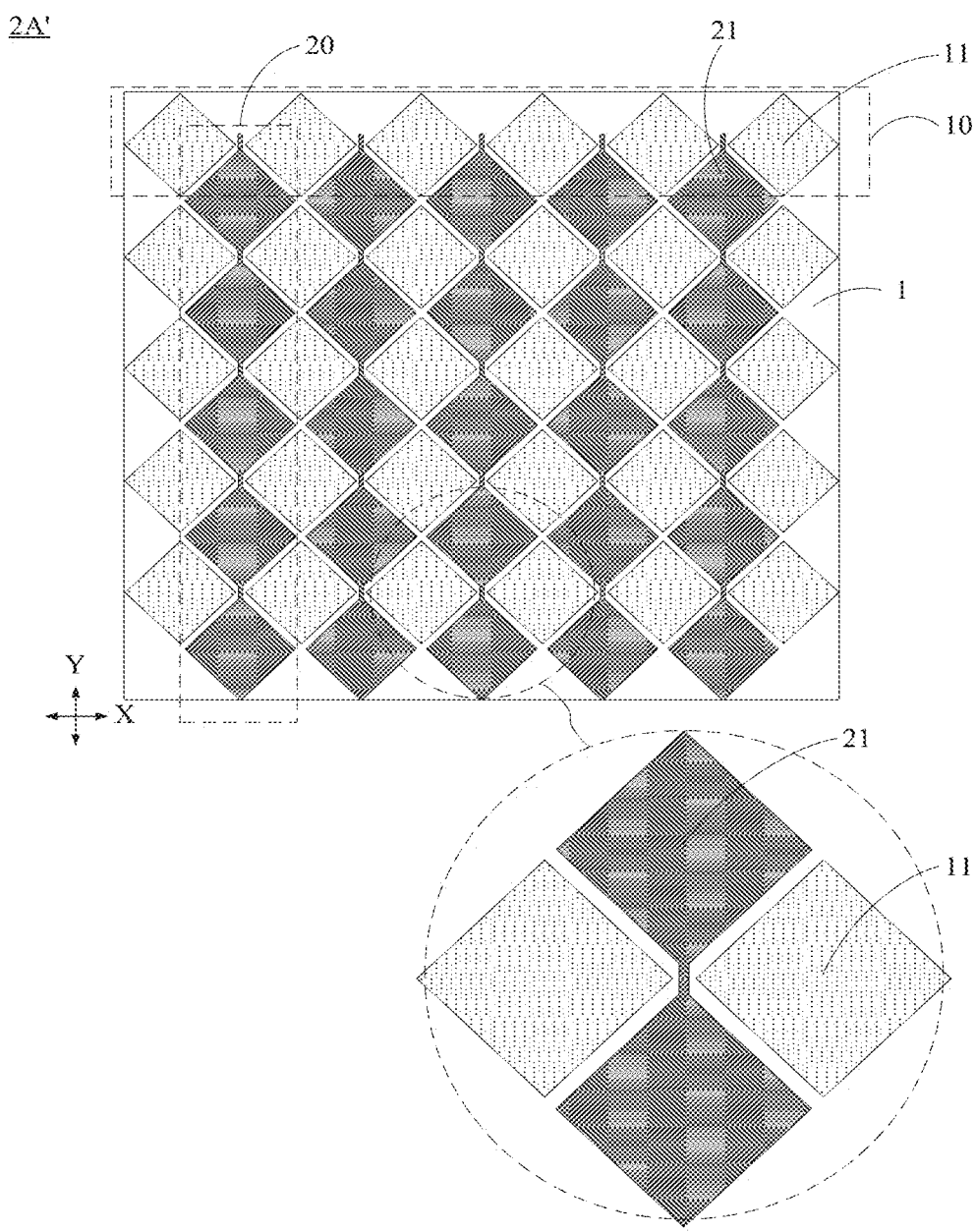
FIG. 8 is another top view of a touch electrode layer in a touch function layer, in accordance with some embodiments.

For example, as shown in FIGS. 7 and 8, the first touch electrodes 11 and the second touch electrodes 21 are disposed in the touch electrode layer 2A'. Every two adjacent second touch electrodes 21 are directly electrically connected in the second direction Y, and every two adjacent first touch electrodes 11 are disposed separately from each other in the first direction X.

Figure 6:
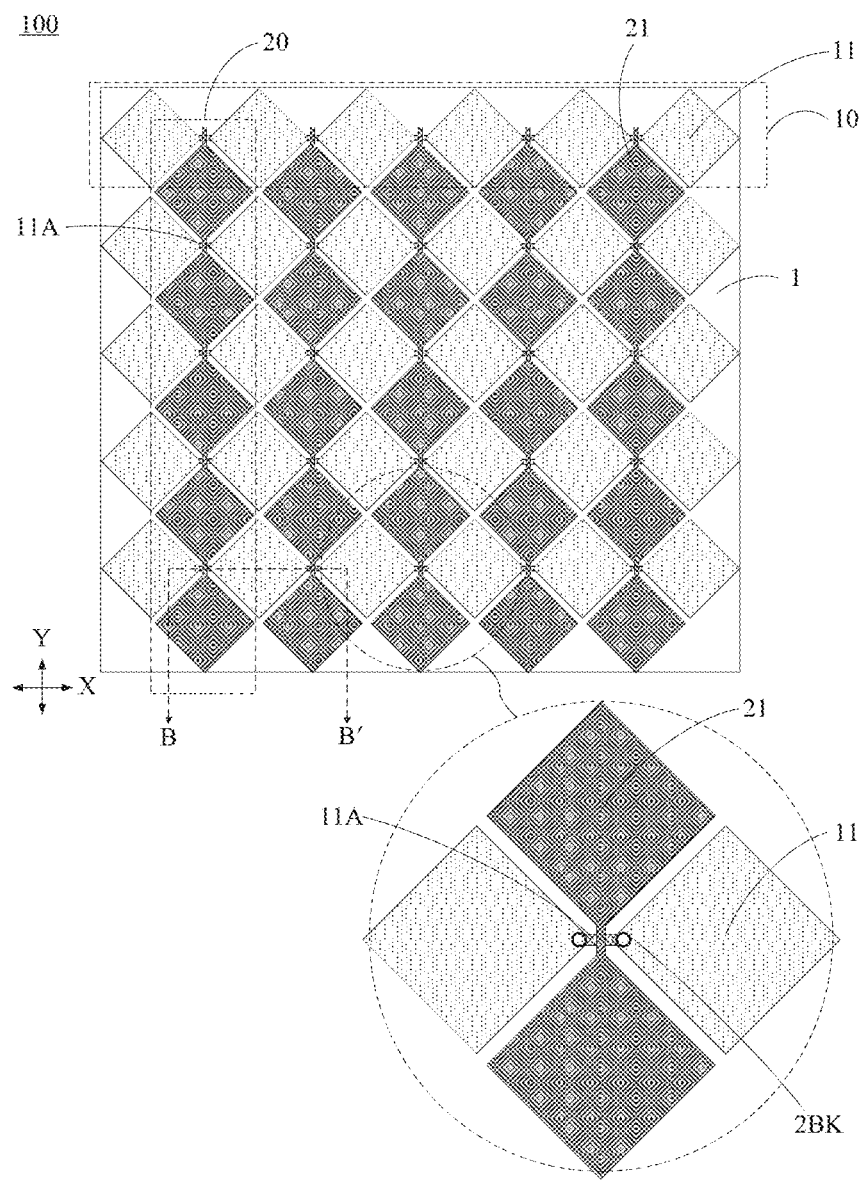
FIG. 6 is another partial enlarged view of a region shown in the dotted box C' in FIG. 1.
Figure 9:
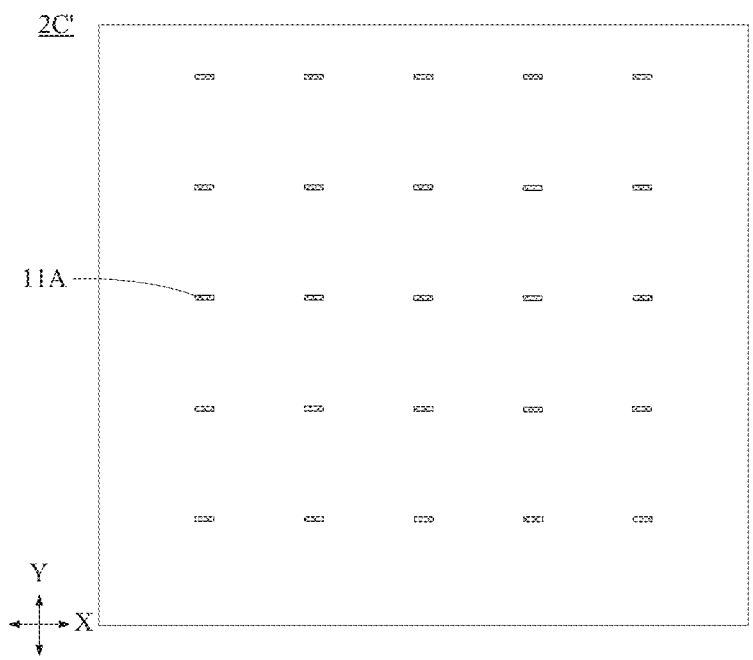
FIG. 9 is another top view of bridge structure layer in a touch function layer, in accordance with some embodiments.

As shown in FIG. 7, the insulating layer 2B has a plurality of via holes 2BK. As shown in FIG. 9, a plurality of bridge structures (i.e., the second bridge structures 11A) included in each first touch unit 10 are disposed in the bridge structure layer 2C'. As shown in FIGS. 6 and 7, every two adjacent first touch electrodes 11 are electrically connected to a second bridge structure 11A through different via holes 2BK penetrating through the first direction X, so that the first touch electrodes 11 in the first touch unit 10 are electrically connected in the first direction X.

In the above embodiments, each second bridge structure 11A may extend in the first direction X, so as to connect two first touch electrodes 11 on both sides thereof.

It will be noted that, FIGS. 6 to 9 only illustrate examples in which the bridge structure layer 2C' is located on the side of the touch electrode layer 2A' away from the base substrate 1, but the embodiments of the present disclosure do not limited thereto. In some other embodiments, in the touch function layer 2 of the touch panel 100, the bridge structure layer 2C' is located on the side of the touch electrode layer 2A' away from the base substrate 1.

In the embodiments of the present disclosure, by directly electrically connecting one of two types of touch electrodes, i.e., the first touch electrodes 11 and the second touch electrodes 21 in the touch electrode layer, and electrically connecting the other type of the two types of touch electrodes through a cross-bridge structure formed by the bridge structures and the via holes 2BK in the insulating layer 2B, the plurality of touch units are formed in the first direction X and the second direction Y, and it is ensured that the first touch electrodes 11 and the second touch electrodes 21 are insulated from each other.

It will be noted that, in the touch area T of the touch panel 100, FIGS. 2 to 9 only show an arrangement and connection structures of touch electrodes in the partial region C' of the normal region C. In the normal region C, an arrangement and connection structures of touch electrodes in other regions except the partial region C' are the same as that of the partial region C'.

The structures of the touch panels 100 shown in FIGS. 3 and 7 are only illustrative. In a case where the touch electrode layer is closer to the base substrate 1 than the bridge structure layer, other film layers may be disposed between the touch electrode layer and the base substrate 1, such as an insulating layer and a planarization layer; in a case where the bridge structure layer is closer to the base substrate 1 than the touch electrode layer, other film layers may be disposed between the bridge structure layer and the base substrate 1, such as an insulating layer and a planarization layer, which will not be described in detail herein.

It will be noted that the base substrate 1 in the touch panel 100 may be a blank substrate. For example, in a case where the touch panel 100 is integrated with a display panel in an on-cell form, the touch function layer 2 may be directly fabricated on the blank substrate to form the touch panel 100, and then the touch panel 100 may be attached to the display panel.

The base substrate 1 in the touch panel 100 may also be a substrate on which some functional devices, pixel circuits or films are fabricated. For example, in a case of integrating a touch structure on a display panel by using the FMLOC technology, the touch function layer 2 may be directly fabricated on an encapsulation layer of the display panel. In this case, the entire substrate on which film layers of pixel circuits and light-emitting devices, and the encapsulation layer are fabricated may be regarded as the base substrate 1 of the touch panel 100.

Figure 20:
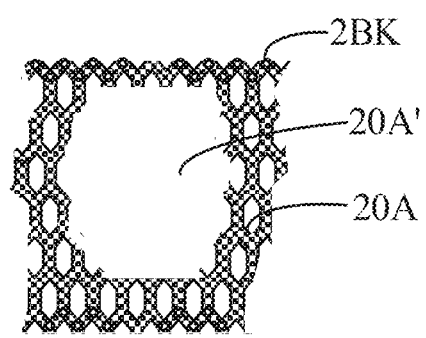
FIG. 20 is a structural diagram of a gap bridge structure in a bridge structure layer in a gap region of a touch panel, in accordance with some embodiments.

In some embodiments, as shown in FIGS. 19 and 20, the first gap electrode 111 is directly electrically connected to the second gap electrode 112, and the third gap electrode 211 and the fourth gap electrode 212 are electrically connected to the gap bridge structure 20A disposed in the bridge structure layer 2C through the via holes 2BK provided in the insulating layer 2B, thereby achieving the electrical connection between the third gap electrode 211 and the fourth gap electrode 212.

Based on this, for example, in order to increase an electrical conductivity of the electrical connection between the third gap electrode 211 and the gap bridge structure 20A, and reduce a loss of signal transmission between the gap bridge structure 20A and the third gap electrode 211, a plurality of via holes 2BK may be provided at the position where the gap bridge structure 20A is electrically connected to the third gap electrode 211, so that the gap bridge structure 20A is electrically connected to the third gap electrode 211 through the plurality of via holes 2BK, and a contact area between the two is increased, so as to achieve an effect of improving the electrical conductivity of the electrical connection between the two.

Further, the plurality of via holes 2BK for electrically connecting the gap bridge structure 20A and the third gap electrode 211 may be arranged in one row, or in a plurality of rows (as shown in FIGS. 19 and 20).

Similar to the embodiments above, in order to increase an electrical conductivity of the electrical connection between the fourth gap electrode 212 and the gap bridge structure 20A, and reduce a loss of signal transmission between the gap bridge structure 20A and the fourth gap electrode 212, a plurality of via holes 2BK may be provided at the position where the gap bridge structure 20A is electrically connected to the fourth gap electrode 212, so that the gap bridge structure 20A is electrically connected to the fourth gap electrode 212 through the plurality of via holes 2BK, and a contact area between the two is increased, so as to achieve an effect of improving the electrical conductivity of the electrical connection between the two.

Further, the plurality of via holes 2BK for electrically connecting the gap bridge structure 20A and the fourth gap electrode 212 may be arranged in one row, or in a plurality of rows (as shown in FIGS. 19 and 20).

It will be noted that, FIGS. 19 and 20 illustrate an example in which the first gap electrode 111 is directly electrically connected to the second gap electrode 112, and the third gap electrode 211 and the fourth gap electrode 212 are electrically connected through the gap bridge structure 20A, but the embodiments of the present disclosure are not limited thereto. In some other embodiments, it may also be that the third gap electrode 211 is directly electrically connected to the fourth gap electrode 212, and the first gap electrode 111 is electrically connected to the second gap electrode 112 through the gap bridge structure 20A.

It will be understood that, a shape of the gap bridge structure 20A may be set as needed.

In some embodiments, as shown in FIGS. 19 and 20, the gap bridge structure 20A is provided with a hollow portion 20A' therein at a crossing position where a structure formed by electrically connecting the first gap electrode 111 and the second gap electrode 112 crosses a structure formed by electrically connecting the third gap electrode 211 and the fourth gap electrode 212, and an orthogonal projection of a conductive pattern CP of the first gap electrode 111 in contact with the second gap electrode 112 on the base substrate 1 at least partially overlaps with an orthogonal projection of the hollow portion 20A' of the gap bridge structure 20A on the base substrate 1.

In the above embodiments, the arrangement of the hollow portion 20A' may reduce an overlapping area of the conductive pattern CP, for connecting the first gap electrode 111 and the second gap electrode 112, and the gap bridge structure 20A, so that a parasitic capacitance generated between the gap bridge structure 20A and the conductive pattern CP for connecting the first gap electrode 111 and the second gap electrode 112 may be reduced.

Figure 21:
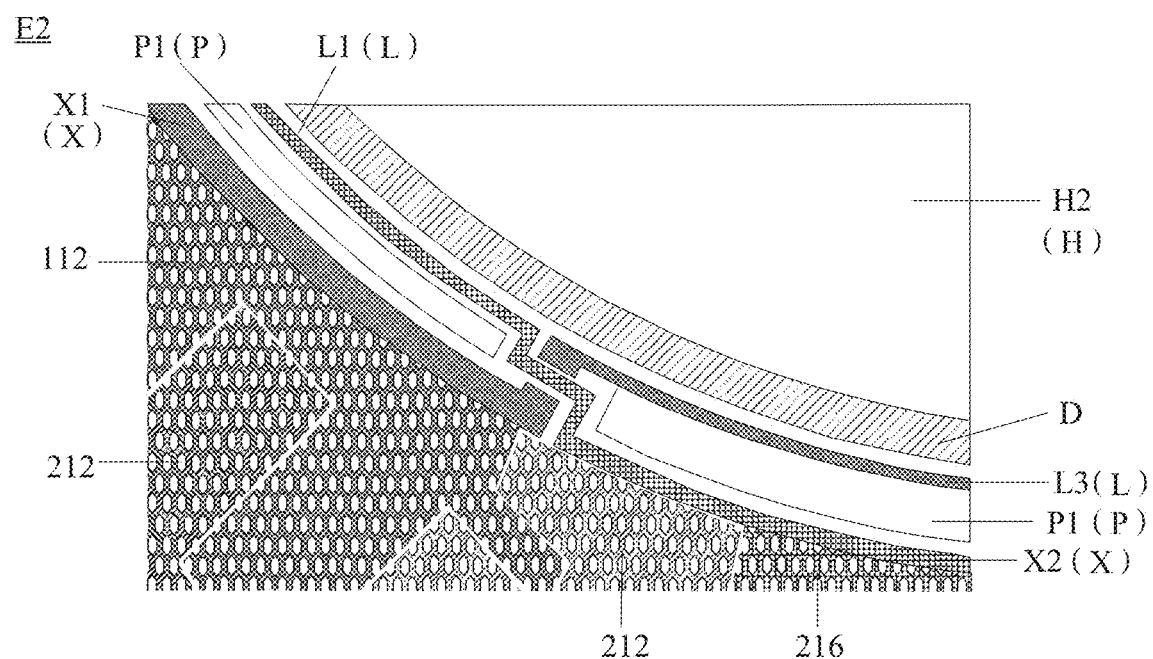
FIG. 21 is a structural diagram of a hole edge region of a touch panel, in accordance with some embodiments.
Figure 22:
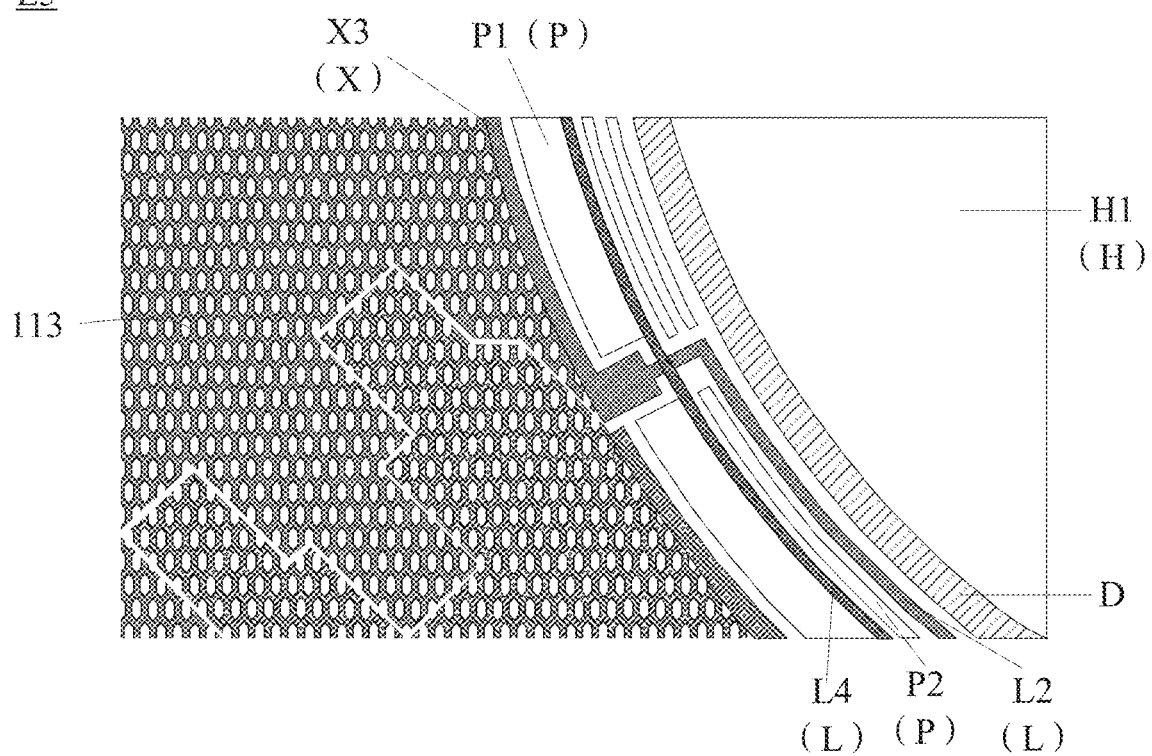
FIG. 22 is another structural diagram of a hole edge region of a touch panel, in accordance with some embodiments.

FIG. 21 shows a partial enlarged structure of a region shown by the dotted box E2 in FIG. 14B, and FIG. 22 shows a partial enlarged structure of a region shown by the dotted box E3 in FIG. 14B. In some embodiments, as shown in FIGS. 21 and 22, the touch function layer 2 further includes: light blocking portions D, at least one connection line L, signal shielding portions P, and electrode lines X.

The light blocking portion D is disposed at the edge of a mounting hole H, and extends along the edge of the mounting hole H to form a closed-loop structure, which may prevent the light passing through the mounting hole H from entering the region around the mounting hole H. In a case where the touch panel 100 is integrated with a display layer, since the region around the mounting hole H is a region where image display is required, the light blocking portion D prevents light passing through the mounting hole H from entering the region around the mounting hole H, so that the light may be prevented from entering the display area and affecting the display quality.

Figure 23A:
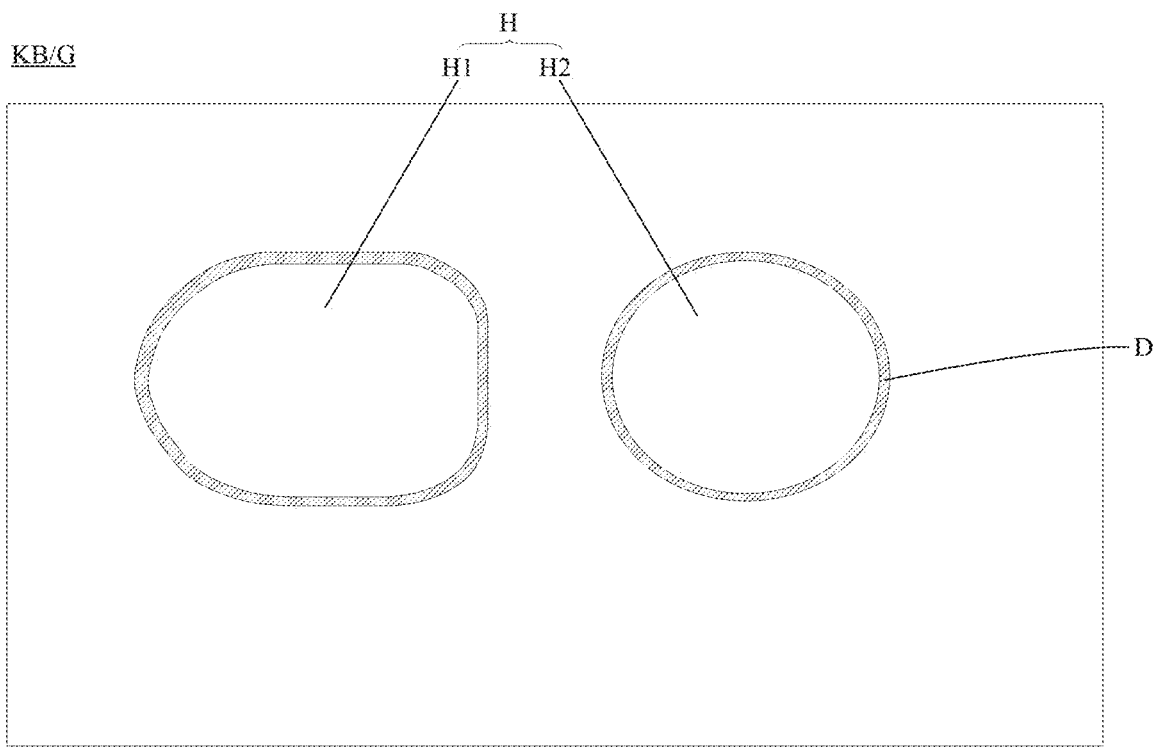
FIGS. 23A to 23D are structural diagrams of a light blocking portion of a touch panel, in accordance with some other embodiments.

For example, as shown in FIG. 23A, the light blocking portion D is of a single-layer closed-loop structure, that is, the light blocking portion D has one complete loop structure, and its structure is simple and easy to manufacture.

Figure 23B:
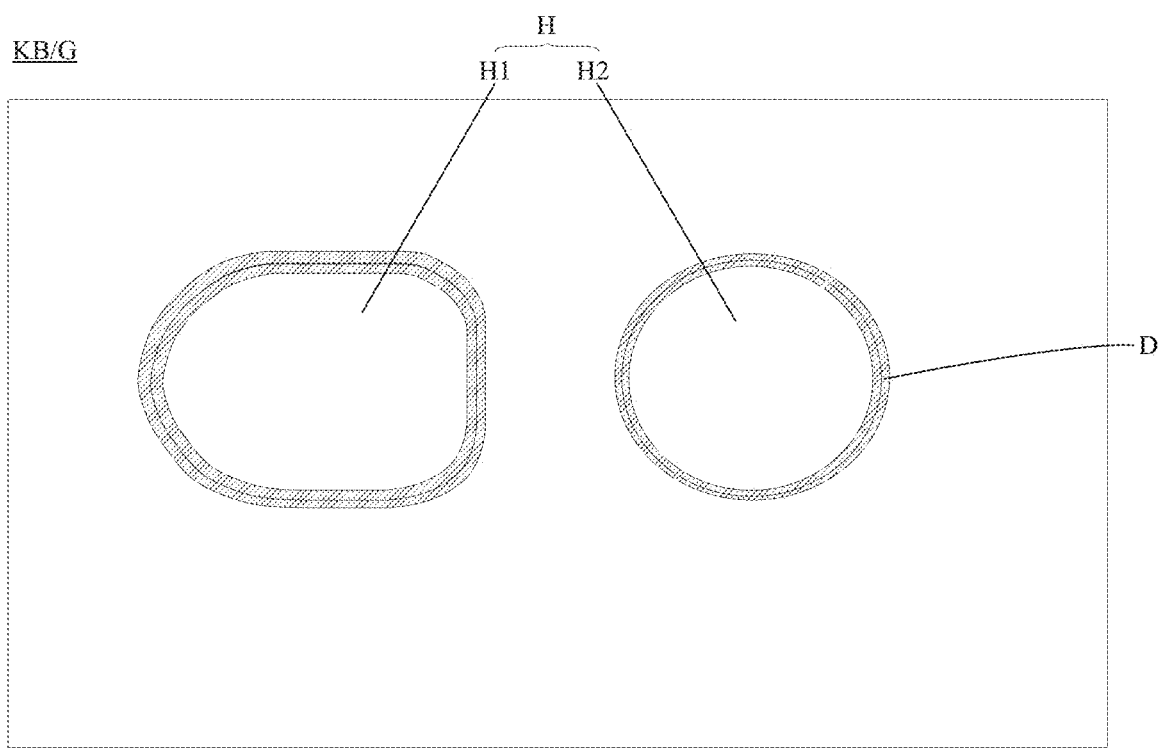

For example, as shown in FIG. 23B, the light blocking portion D may also be of a double-layer closed-loop structure, that is, the light blocking portion D has two complete loop structures, which increases an blocking area of the light blocking portion D, thereby facilitating the improvement of the light-shielding effect of the light blocking portion D.

Figure 23C:
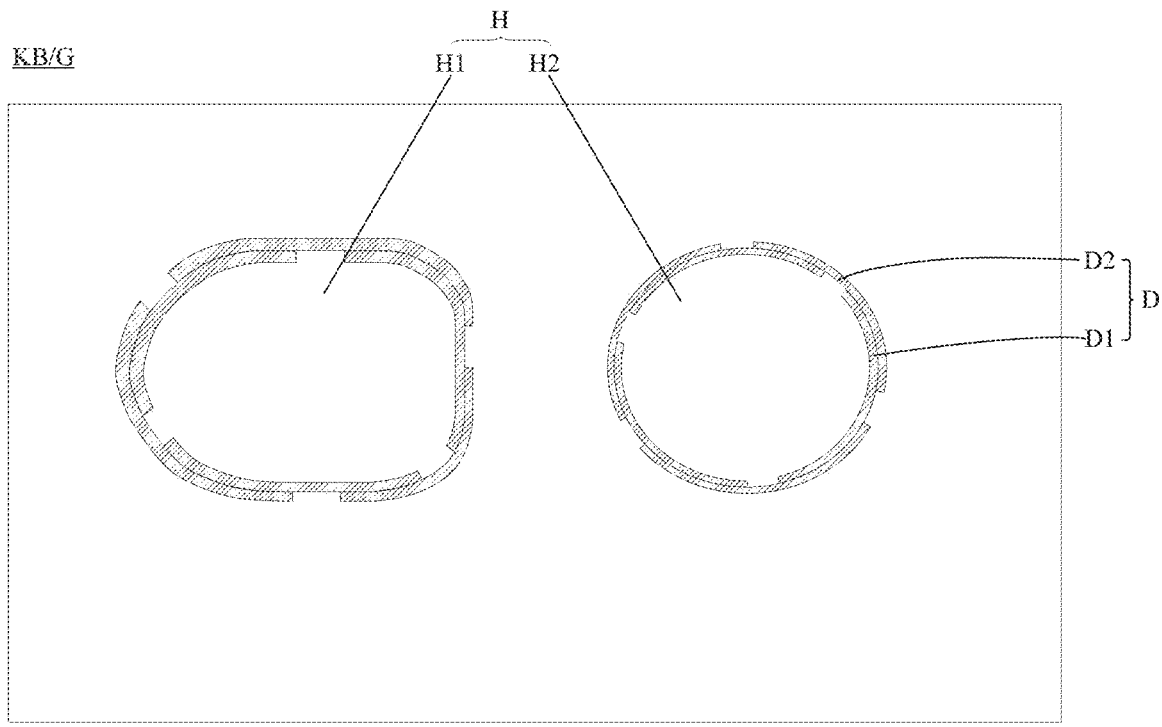
Figure 23D:
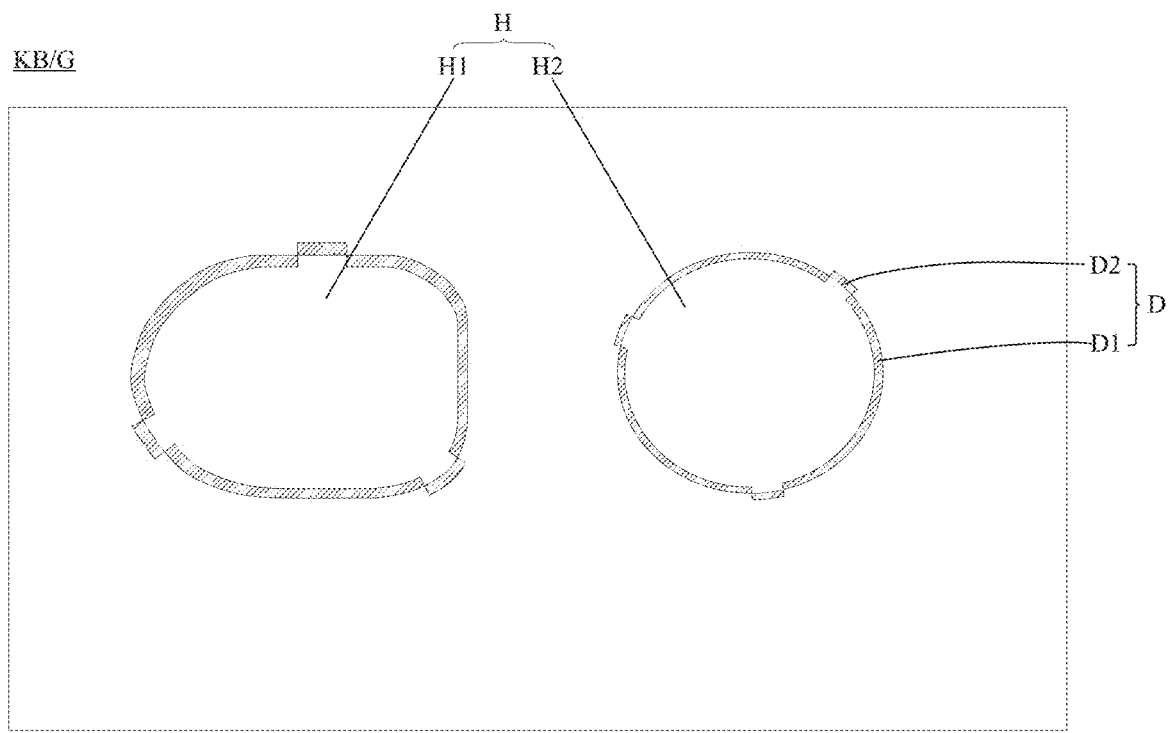

For example, as shown in FIG. 23C, the light blocking portion D may also be of a loop structure with alternating single-layers and double-layers. In this case, the light blocking portion D has an inner loop structure D1 and an outer loop structure D2, both of which are disposed discontinuously. In a direction of the edge of the mounting hole H, overlapping portions of the inner loop structure D1 and the outer loop structure D2 form the double-layer structures, and non-overlapping portions of the inner loop structure D1 and the outer loop structure D2 form the single-layer structures. Alternatively, the inner loop structure D1 do not overlap the outer loop structure D2. In this case, as shown in FIG. 23D, in direction of the edge of the mounting hole H, the light blocking portion D is of a single-layer loop structure.

In some embodiments, a width of the light blocking portion D is in a range of 60 μm to 100 μm, such as 60 μm, 68 μm, 80 μm, 90 μm, 92 μm, or 100 μm.

For example, in a case where the line width of the metal mesh WD located in the gap region G is 4 μm, a ratio of the width of the light blocking portion D to the line width of the metal mesh WD located in the gap region G is in a range of 15 to 25, such as 15, 17, 20, 23, or 25.

For example, in a case where the line width of the metal mesh WD located in the gap region G is 5 μm, the ratio of the width of the light blocking portion D to the line width of the metal mesh WD located in the gap region G is in a range of 12 to 20, such as 12, 13.6, 16, 18, 18.4, or 20.

The at least one connection line L is disposed at a side of the light blocking portion D away from the mounting hole H, and extends along the contour of the mounting hole H. The connection line L is used to electrically connect two adjacent first touch electrodes 11 arranged in the first direction X, or electrically connect two adjacent second touch electrodes 21 arranged in the second direction Y. The at least one connection line L includes at least one of the first connection line L1, the second connection line L2, and the third connection line L3 described above.

FIG. 21 shows an example in which two connection lines L are disposed at the side of the light blocking portion D away from the second mounting hole H2. FIG. 22 shows an example in which two connection lines L are disposed at the side of the light blocking portion D away from the first mounting hole H1.

It will be noted that, FIG. 21 show a case that the connection lines L include a first connection line L1 and a third connection line L3, and FIG. 22 show a case that the connection lines L include a second connection line L2 and a fourth connection line L4. The arrangement positions of the first connection line L1, the second connection line L2 and the third connection line L3 in the touch function layer 2 and a manner in which they are electrically connected to the touch electrodes may be referred to the corresponding embodiments described above, which will not be repeated herein.

In some embodiments, a width of the connection line L is in a range of 20 μm to 60 μm, such as 20 μm, 30 μm, 40 μm, 50 μm, or 60 μm.

For example, in the case where the line width of the metal mesh WD located in the gap region G is 4 μm, a ratio of the width of the connection line L to the line width of the metal mesh WD located in the gap region G is in a range of 5 to 15, such as 5, 7.5, 10, 12.5, or 15.

For example, in the case where the line width of the metal mesh WD located in the gap region G is 5 μm, the ratio of the width of the connection line L to the line width of the metal mesh WD located in the gap region G is in a range of 4 to 12, such as 4, 6, 8, 9, 10, or 12.

In some embodiments, as shown in FIGS. 21 and 22, electrode lines X are provided at an edge of a touch electrode proximate to a mounting hole H. The electrode line X is electrically connected to the touch electrode and extends along the contour of the mounting hole H. The electrode line X is a strip electrode, and a width thereof may be greater than the width of the mesh line of the metal mesh of the touch electrode. In this way, when the touch electrode is required to be electrically connected to a connection line L, the electrode line X may be used to achieve the electrical connection between the touch electrode and the connection line L. Compared with a connection manner of directly electrically connecting the touch electrode with a structure of metal mesh to the connection line L, this connection manner may improve the conductivity between the touch electrode and the connection line L, so that a transmission rate of touch signals is increased.

The electrode line X may be made of the same material and disposed in the same layer as the touch electrode, so that the electrode line X may be directly electrically connected to the touch electrode.

Based on this, in a case where a touch electrode and a connection line L to be connected thereto are in different layers, an electrode line is provided to directly electrically connect the touch electrode, and the electrode line X is connected to the connection line L through the via holes 2BK, so that the electrical connection between the touch electrode and the connection line L may be achieved. Therefore, compared with a case where the touch electrode with the structure of metal mesh is electrically connected to the connection line L through the via holes, the electrode line X with the strip electrode structure is electrically connected to the connection line L through the via holes 2BK, so that an alignment accuracy of the electrode line X connected to the touch electrode and the via holes 2BK may be improved, and the electrical conductivity of the electrical connection between the touch electrode and the connection line L is improved.

For example, as shown in FIG. 21, a first electrode line X1 is disposed at an edge of the second gap electrode 112 proximate to the second mounting hole H2, and the first electrode line X1 is electrically connected to the second gap electrode 112. The first electrode line X1 and the third connection line L3 are electrically connected to a bridge structure in the bridge structure layer 2C through via holes 2BK provided in the insulating layer 2B, so that the electrical connection between the second gap electrode 112 and the sixth hole edge electrode 114 (as shown in FIG. 14B) is achieved. A second electrode line X2 is disposed at an edge of the fourth hole edge electrode 216 proximate to the second mounting hole H2, the second electrode line X2 is electrically connected to the fourth hole edge electrode 216, and the second electrode line X2 is directly electrically connected to the first connection line L1, so that the electrical connection between the third hole edge electrode 215 (as shown in FIG. 14B) and the fourth hole edge electrode 216 may be achieved.

For example, as shown in FIG. 22, a third electrode line X3 is disposed at an edge of the fifth hole edge electrode 113 proximate to the first mounting hole H1, the third electrode line X3 is electrically connected to the fifth hole edge electrode 113, and the third electrode line X3 is directly electrically connected to the second connection line L2, so that the electrical connection between the fifth hole edge electrode 113 and the first gap electrode 111 (as shown in FIG. 14B) is achieved.

It will be noted that, the connection manner between the electrode line X and the connection line L in FIGS. 21 and 22 is only illustrative, and the electrical connection between the two may be referred to the arrangement in the embodiments in which the touch electrode is electrically connected to the connection line L. The electrical connection between the touch electrode and the connection line L may be regarded as the electrical connection between the electrode line X electrically connected to the touch electrode and the connection line, so details will not be repeated herein.

In some embodiments, a width of the electrode line X is in a range of 20 μm to 60 μm, such as 20 μm, 30 μm, 40 μm, 50 μm or 60 μm.

For example, in the case where the line width of the metal mesh WD located in the gap region G is 4 μm, a ratio of the width of the electrode line X to the line width of the metal mesh WD located in the gap region G is in a range of 5 to 15, such as 5, 7.5, 10, 12.5, or 15.

For example, in the case where the line width of the metal mesh WD located in the gap region G is 5 μm, the ratio of the width of the electrode line X to the line width of the metal mesh WD located in the gap region G is in a range of 4 to 12, such as 4, 6, 8, 10, or 12.

In some embodiments, the touch function layer 2 further includes signal shielding portions P. A signal shielding portion P is arranged between the connection line L and the electrode line X, or arranged between different connection lines L. The signal shielding portion P extends along the contour of the mounting hole H. The signal shielding portion P is used to prevent crosstalk between the connection line L and the electrode line X that transmit different touch signals or between different connection lines, which are located at both sides of the signal shielding portion P. It will be noted that, the term "different touch signals" refers to a transmit (TX) signal and a receive (RX) signal, and one of the TX signal and the RX signal is transmitted on the first touch unit, and the other is transmitted on the second touch unit.

For example, the signal shielding portion P may not be connected to other conductive structures in the touch panel, or may be grounded, or may be provided with a low-voltage signal, so as to achieve the function of shielding different touch signals at both sides thereof.

For example, as shown in FIG. 21, the first electrode line X1 and the first connection line L1 are provided with a first signal shielding portion P1 therebetween, and the second electrode line X2 and the third connection line L3 are provided with a first signal shielding portion P1 therebetween. The first signal shielding portions P1 may prevent crosstalk between different touch signals transmitted on the first electrode line X1 and the first connection line L1, and crosstalk between different touch signals transmitted on the second electrode line X2 and the third connection line L3.

For example, as shown in FIG. 14B, a hole edge electrode K at the upper left position of the first mounting hole H1 is a seventh hole edge electrode 217, and a hole edge electrode K at the lower left position of the first mounting hole H1 is an eighth hole edge electrode 218. The seventh hole edge electrode 217 is electrically connected to the eighth hole edge electrode 218 through a fourth connection line L4. Based on this, as shown in FIG. 22, a first signal shielding portion P1 is provided between the third electrode line X3 and the fourth connection line L4 to prevent crosstalk between touch signals transmitted on the third electrode line X3 and the fourth connection line L4. Two connection lines, the fourth connection line L4 and the second connection line L2, are provided between the first signal shielding portion P1 and the light blocking portion D. Since different touch signals are transmitted on the fourth connection line L4 and the second connection line L2, a second signal shielding portion P2 is provided between the fourth connection line L4 and the second connection line L2 to prevent crosstalk between the touch signals transmitted on the fourth connection line L4 and the second connection line L2.

In some embodiments, a width of the signal shielding portion P is in a range of 10 μm to 50 μm, such as 10 μm, 20 μm, 30 μm, 40 μm, or 50 μm.

For example, in the case where the line width of the metal mesh WD located in the gap region G is 4 μm, a ratio of the width of the signal shielding portion P to the line width of the metal mesh WD located in the gap region G is in a range of 2.5 to 12.5, such as 2.5, 5, 7.5, 10, or 12.5.

For example, in the case where the line width of the metal mesh WD located in the gap region G is 5 μm, a ratio of the width of the signal shielding portion P to the line width of the metal mesh WD located in the gap region G is in a range of 2 to 10, such as 2, 4, 6, 8, or 10.

Figure 24:
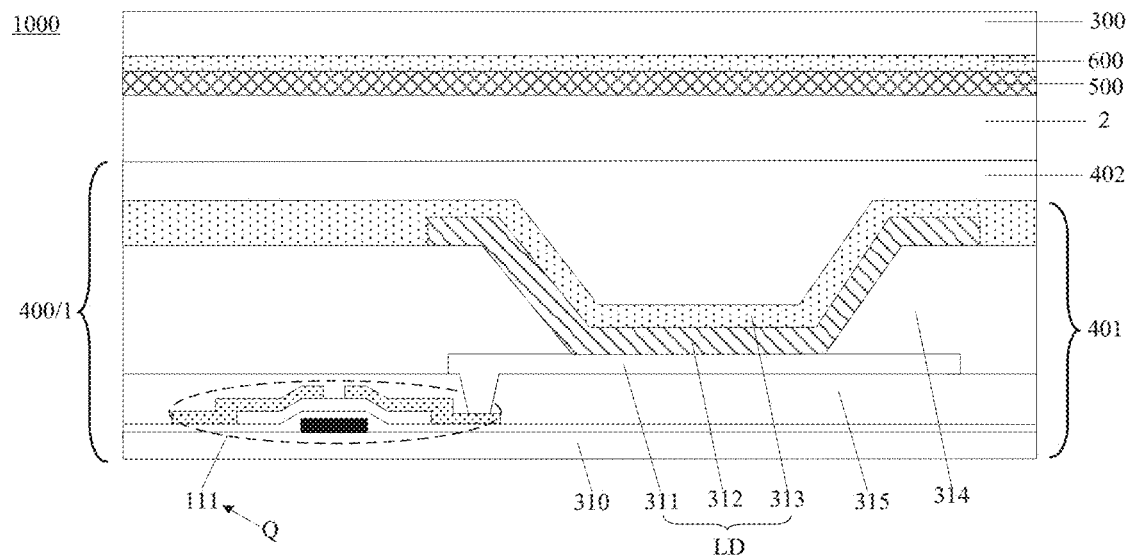
FIG. 24 is a sectional diagram of a touch display apparatus, in accordance with some embodiments.
Figure 25:
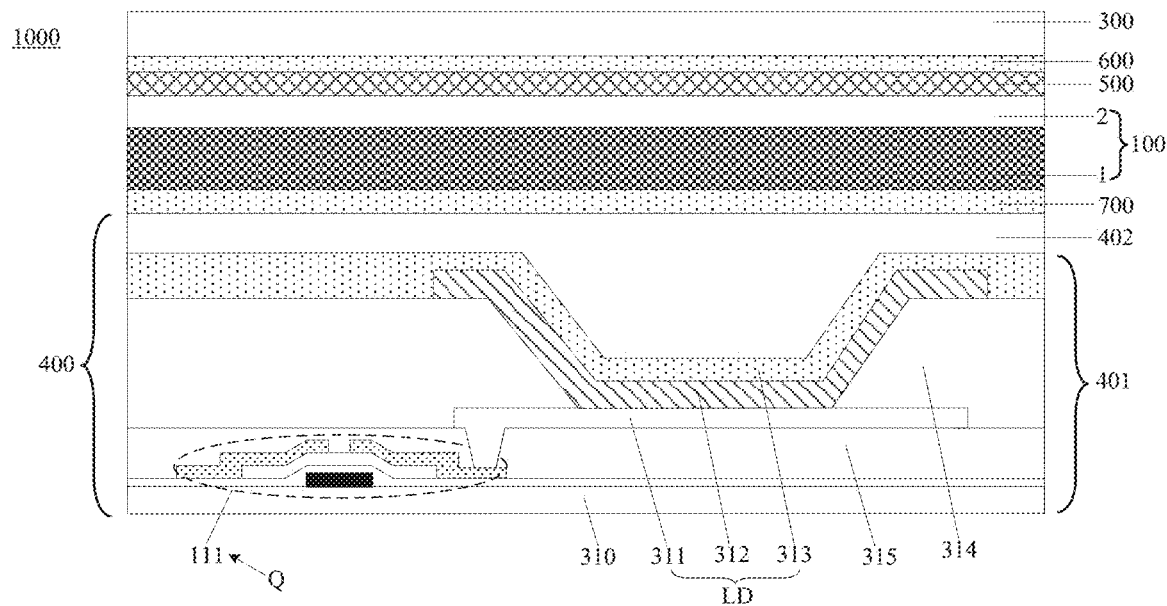
FIG. 25 is another sectional diagram of a touch display apparatus, in accordance with some embodiments.

As shown in FIGS. 24 and 25, some embodiments of the present disclosure provide a touch display apparatus 1000. The touch display apparatus 1000 may be an electroluminescent display apparatus or a photoluminescent display apparatus. In a case where the touch display apparatus 1000 is an electroluminescent display apparatus, the electroluminescent display apparatus may be an organic light-emitting diode (OLED) display apparatus or a quantum dot light-emitting diode (QLED) display apparatus. In a case where the touch display apparatus 1000 is a photoluminescence display apparatus, the photoluminescence display apparatus may be a quantum dot photoluminescence display apparatus.

As shown in FIGS. 24 and 25, in the case where the touch display apparatus 1000 is an electroluminescent display apparatus, main structures of the electroluminescent display apparatus include an electroluminescent display panel 400, the touch panel 100 as described in some embodiments above, a polarizer 500, a first optically clear adhesive (OCA) 600, and a cover glass 300 arranged in sequence.

The electroluminescent display panel 400 includes a display substrate 401 and an encapsulation layer 402 for encapsulating the display substrate 401. Here, the encapsulation layer 402 may be an encapsulation film or an encapsulation substrate.

In some embodiments, as shown in FIG. 24, the touch function layer 2 of the touch panel 100 is directly disposed on the encapsulation layer 402, so that the electroluminescent display panel 400 may be regarded as the base substrate 1 of the touch panel 100, and this structure is conducive to achieving thin and light display apparatus.

In some other embodiments, as shown in FIG. 25, the touch function layer 2 of the touch panel 100 is disposed on the base substrate 1, and the base substrate 1 is attached to the encapsulation layer 402 through a second optically clear adhesive 700. A material of the base substrate 1 may be, for example, polyethylene terephthalate (PET), polyimide (PI), cyclo olefin polymer (COP).

As shown in FIGS. 24 and 25, each sub-pixel of the display substrate 401 includes a light-emitting device LD and a driving circuit Q that are disposed on a base 310, and the driving circuit Q includes a plurality of thin film transistors 111. The light-emitting device LD includes an anode 311, a light-emitting functional layer 312 and a cathode 313, and the anode 311 is electrically connected to a drain of a thin film transistor 111 that serves as a driving transistor among the plurality of thin film transistors 111.

The display substrate 401 further includes a pixel defining layer 314. The pixel defining layer 314 includes a plurality of openings, and a light-emitting device is disposed in one opening.

In some embodiments, the light-emitting functional layer 312 includes a light-emitting layer. In some other embodiments, the light-emitting functional layer 312 further includes one or more of an electron transporting layer (ETL), an electron injection layer (EIL), a hole transporting layer (HTL) and a hole injection layer (HIL) in addition to the light-emitting layer.

As shown in FIGS. 24 and 25, the display substrate 401 further includes a planarization layer 315 disposed between the thin film transistor 111 and the anode 311.

In the case where the touch display apparatus 1000 is the electroluminescent display apparatus, the touch display apparatus 1000 may be a top-emission display apparatus; in this case, the anode 311 proximate to the base 310 is opaque, and the cathode 313 away from the base 310 is transparent or translucent. The touch display apparatus 1000 may also be a bottom-emission display apparatus, and in this case, the anode 311 proximate to the base 310 is transparent or translucent, and the cathode 313 away from the base 310 is opaque. The touch display apparatus 1000 may also be a double-sided light-emitting display apparatus, and in this case, the anode 311 proximate to the base 310 and the cathode 313 away from the base 310 are both transparent or translucent.

Beneficial effects that may be achieved by the display apparatus 1000 are the same as beneficial effects that may be achieved by the display panel 100, and details will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A touch panel having a touch area, the touch panel comprising:
    a base substrate; and
    a touch function layer disposed on the base substrate, the touch function layer including a plurality of first touch units extending in a first direction and a plurality of second touch units extending in a second direction; each first touch unit including a plurality of first touch electrodes arranged in the first direction and connected in series, each second touch unit including a plurality of second touch electrodes arranged in the second direction and connected in series; the first touch electrodes and the second touch electrodes being insulated from each other; the first direction intersecting the second direction;
    wherein the base substrate has at least two mounting holes located in the touch area, the touch function layer is hollowed out at positions corresponding to the at least two mounting holes and has a gap region at a position corresponding to a region between two adjacent mounting holes; in a first touch unit passing through the gap region, first touch electrodes located in the gap region serve as a first gap electrode and a second gap electrode that are arranged in the first direction and are electrically connected to each other; in a second touch unit passing through the gap region, second touch electrodes located in the gap region serve as a third gap electrode and a fourth gap electrode that are arranged in the second direction and are electrically connected to each other; the third gap electrode is located between the first gap electrode and the second gap electrode in the first direction,
    wherein an edge of at least one of the third gap electrode or the fourth gap electrode has at least one branch, the edge is proximate to at least one of the first gap electrode or the second gap electrode, and the at least one branch extends into the at least one of the first gap electrode or the second gap electrode; or
    wherein an edge of at least one of the third gap electrode or the fourth gap electrode has at least one branch, the edge is proximate to at least one of the first gap electrode or the second gap electrode, the at least one branch extends into the at least one of the first gap electrode or the second gap electrode, and an edge of the branch is zigzag-shaped.

2. The touch panel according to claim 1, wherein a contour of the first gap electrode and/or a contour of the second gap electrode are at least partially different from a contour of a first touch electrode located in a non-gap region;
    a contour of the third gap electrode and/or a contour of the fourth gap electrode are at least partially different from a contour of a second touch electrode located in the non-gap region; and the third gap electrode is embedded in an integrated electrode formed by electrically connecting the first gap electrode and the second gap electrode.

3. The touch panel according to claim 1, wherein a mutual capacitance value between a whole of the first gap electrode and the second gap electrode and a whole of the third gap electrode and the fourth gap electrode is C1;
  a mutual capacitance value between a first touch electrode and a second touch electrode that are located in a non-gap region is C2; and
  a ratio of C1 to C2 is in a range of 0.75 to 0.8.

4. The touch panel according to claim 1, wherein a ratio of a sum of areas of the third gap electrode and the fourth gap electrode to a sum of areas of the first gap electrode and the second gap electrode is in a range of 1.2 to 1.4.

5. The touch panel according to claim 1, wherein a ratio of areas of a second touch electrode and a first touch electrode that are in a non-gap region is in a range of 0.9 to 1.

6. The touch panel according to claim 1, wherein shapes of portions, proximate to each other, of contours of the third gap electrode and the first gap electrode are complementary, and shapes of portions, proximate to each other, of contours of the third gap electrode and the second gap electrode are complementary.

7. The touch panel according to claim 6, wherein the contour of the third gap electrode has protrusions in various shapes, and the protrusions in various shapes include at least two types of wavy protrusions, rectangular protrusions, trapezoidal protrusions or triangular protrusions;
  the third gap electrode includes a first portion, a second portion, and a third portion that are connected as a whole, and the first portion, the second portion and the third portion are arranged in sequence in a direction from the third gap electrode to the fourth gap electrode; and average dimensions of the first portion and the third portion in the first direction are both less than an average dimension of the second portion in the first direction; or
  the contour of the third gap electrode has protrusions in various shapes, and the protrusions in various shapes include wavy protrusions and at least one type of rectangular protrusions, trapezoidal protrusions or triangular protrusions;
  the third gap electrode includes: a first portion, a second portion, and a third portion that are connected as a whole, and the first portion, the second portion and the third portion are arranged in sequence in a direction from the third gap electrode to the fourth gap electrode; and
  average dimensions of the first portion and the third portion in the first direction are both less than an average dimension of the second portion in the first direction; and the wavy protrusions are on a portion, proximate to the first gap electrode, of a contour of the first portion and a portion, proximate to the second gap electrode, of a contour of the first portion.

8. The touch panel according to claim 1, wherein the two adjacent mounting holes located at both sides of the gap region are a first mounting hole and a second mounting hole, and the first mounting hole and the second mounting hole are arranged in the first direction; and
  the first gap electrode is adjacent to a side of the first mounting hole proximate to the gap region, and the second gap electrode is adjacent to a side of the second mounting hole proximate to the gap region;
  wherein a region, around the first mounting hole and the second mounting hole and not including the gap region, in the touch area is a hole edge region; and a region, except for the gap region and the hole edge region, in the touch area is a normal region.

9. The touch panel according to claim 8, wherein the first touch electrodes and the second touch electrodes each have a structure of metal mesh;
  a line width of metal mesh of at least one of the first gap electrode, the second gap electrode, the third gap electrode or the fourth gap electrode is greater than a line width of metal mesh of touch electrodes located in the normal region; or
  the first touch electrodes and the second touch electrodes each have a structure of metal mesh;
  a line width of metal mesh of at least one of the first gap electrode, the second gap electrode, the third gap electrode or the fourth gap electrode is greater than a line width of metal mesh of touch electrodes located in the normal region; the line width of the metal mesh of the at least one of the first gap electrode, the second gap electrode, the third gap electrode or the fourth gap electrode is in a range of 3.8 μm to 5.2 μm; and
  the line width of the metal mesh of the touch electrodes located in the normal region is in a range of 2.8 μm to 4.2 μm.

10. The touch panel according to claim 8, wherein the first gap electrode includes a first main sub-electrode and a first compensation sub-electrode arranged proximate to the first mounting hole; the first main sub-electrode has a structure of metal mesh, the first compensation sub-electrode is a planar electrode, and the first main sub-electrode is electrically connected to the first compensation sub-electrode; and/or,
  the second gap electrode includes a second main sub-electrode and a second compensation sub-electrode arranged proximate to the second mounting hole; the second main sub-electrode has a structure of metal mesh, the second compensation sub-electrode is a planar electrode, and the second main sub-electrode is electrically connected to the second compensation sub-electrode.

11. The touch panel according to claim 8, wherein the touch function layer further includes a first connection line extending along a contour of the second mounting hole;
  wherein in a second touch unit passing through the first mounting hole, two second touch electrodes located at both sides of the first mounting hole in the second direction serve as a first hole edge electrode and a second hole edge electrode; and the first hole edge electrode, the third gap electrode, the fourth gap electrode and the second hole edge electrode are electrically connected in sequence;
  in a second touch unit passing through the second mounting hole, two second touch electrodes located at both sides of the second mounting hole in the second direction serve as a third hole edge electrode and a fourth hole edge electrode; and the third hole edge electrode is electrically connected to the fourth hole edge electrode through the first connection line; and
  a whole formed by electrically connecting the first hole edge electrode, the third gap electrode, the fourth gap electrode and the second hole edge electrode is insulated from a whole formed by electrically connecting the third hole edge electrode, the fourth hole edge electrode and the first connection line.

12. The touch panel according to claim 8, wherein the touch function layer further includes a second connection line extending along a contour of the first mounting hole and a third connection line extending along a contour of the second mounting hole;
- wherein in the first touch unit passing through the first mounting hole and the second mounting hole, a first touch electrode located at a side of the first mounting hole away from the second mounting hole serves as a fifth hole edge electrode, and a first touch electrode located at a side of the second mounting hole away from the first mounting hole serves as a sixth hole edge electrode;
- the fifth hole edge electrode is electrically connected to the first gap electrode through the second connection line; and
- the sixth hole edge electrode is electrically connected to the second gap electrode through the third connection line.

13. The touch panel according to claim 1, wherein each second touch unit further includes a plurality of bridge structures; in the second direction, any two adjacent second touch electrodes are electrically connected through a bridge structure;
- the third gap electrode is electrically connected to the fourth gap electrode through a bridge structure located in the gap region; in the second touch unit passing through the gap region, a line connecting a center of any bridge structure located in a non-gap region and a center of the bridge structure for connecting the third gap electrode and the fourth gap electrode intersects the second direction.

14. The touch panel according to claim 13, wherein a layer where the first touch electrodes and the second touch electrodes are located serves as a touch electrode layer;
- any two adjacent first touch electrodes are directly electrically connected in the first direction, and any two adjacent second touch electrodes are disposed separately from each other in the second direction; and
- a layer where bridge structures of the plurality of second touch units are located serves as a bridge structure layer, the bridge structure layer is located on a side of the touch electrode layer proximate to or away from the base substrate;
- the touch function layer further includes an insulating layer located between the touch electrode layer and the bridge structure layer, the insulating layer has a plurality of via holes;
- wherein in the second direction, any two adjacent second touch electrodes are electrically connected to a bridge structure through different via holes;
- the bridge structure for connecting the third gap electrode and the fourth gap electrode is a gap bridge structure, and the third gap electrode and the fourth gap electrode are electrically connected to the gap bridge structure through different via holes in the insulating layer.

15. The touch panel according to claim 14, wherein the gap bridge structure has a hollow portion; an orthogonal projection of a conductive pattern of the first gap electrode in contact with the second gap electrode on the base substrate partially overlaps an orthogonal projection of the hollow portion of the gap bridge structure on the base substrate.

16. The touch panel according to claim 14, wherein the touch electrode layer includes: a third hole edge electrode, a fourth hole edge electrode, a fifth hole edge electrode, a sixth hole edge electrode, a second connection line, and a third connection line; and
- the bridge structure layer includes a first connection line, and the first connection line is electrically connected to the third hole edge electrode and the fourth hole edge electrode through different via holes in the insulating layer;
- wherein the second connection line is directly electrically connected to the fifth hole edge electrode and the first gap electrode; and
- the third connection line is directly electrically connected to the sixth hole edge electrode and the second gap electrode.

17. The touch panel according to claim 1, wherein in a radial direction of each mounting hole, the touch function layer further includes:
- a light blocking portion, at least one connection line, a first signal shielding portion and an electrode line that extend along a contour of the mounting hole in sequence;
- wherein the light blocking portion extends along an edge of the mounting hole to form a closed-loop structure, and the light blocking portion is configured to block light passing through the mounting hole from entering a region around the mounting hole;
- the connection line is configured to electrically connect two adjacent first touch electrodes arranged in the first direction, or electrically connect two adjacent second touch electrodes arranged in the second direction;
- the electrode line is configured to be electrically connected to an edge, proximate to the mounting hole, of a first touch electrode or a second touch electrode;
- the first signal shielding portion is disposed at least between the connection line and the electrode line that are adjacent.

18. The touch panel according to claim 17, wherein the at least one connection line includes a plurality of the connection lines disposed between the light blocking portion and the first signal shielding portion;
- the touch function layer further includes a second signal shielding portion provided between two adjacent connection lines, the second signal shielding portion extends along the contour of the mounting hole.

19. A touch display apparatus, comprising the touch panel according to claim 1.

* * * * *

UNITED STATES PATENT AND TRADEMARK OFFICE
CERTIFICATE OF CORRECTION

PATENT NO. : 11,947,762 B2
APPLICATION NO. : 17/617401
DATED : April 2, 2024
INVENTOR(S) : Lingran Wang et al.

It is certified that error appears in the above-identified patent and that said Letters Patent is hereby corrected as shown below:

In the Specification

Column 1, Line 9 The PCT international filing date filed as September 10, 2020 is incorrect and should be October 27, 2020.

Signed and Sealed this
First Day of October, 2024

Katherine Kelly Vidal
*Director of the United States Patent and Trademark Office*